(12) United States Patent
Oka

(10) Patent No.: US 7,358,829 B2
(45) Date of Patent: Apr. 15, 2008

(54) TRANSMISSION APPARATUS, COMMUNICATION APPARATUS AND MOBILE RADIO APPARATUS

(75) Inventor: Tatsuto Oka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 11/384,860

(22) Filed: Mar. 21, 2006

(65) Prior Publication Data

US 2006/0234652 A1 Oct. 19, 2006

(30) Foreign Application Priority Data

Mar. 22, 2005 (JP) ............................. 2005-081717

(51) Int. Cl.
*H03F 1/32* (2006.01)
*H04B 1/04* (2006.01)

(52) U.S. Cl. ...................... 332/145; 332/150; 332/151; 455/127.1

(58) Field of Classification Search ................ 332/145, 332/150, 151; 455/127.1, 114.2, 115.1, 102
See application file for complete search history.

(56) References Cited

U.S. PATENT DOCUMENTS

| 6,366,177 | B1 | 4/2002 | McCune et al. |
| 2005/0079835 | A1 | 4/2005 | Takabayashi et al. |
| 2006/0202774 | A1* | 9/2006 | Hirano ................. 332/144 |

FOREIGN PATENT DOCUMENTS

| JP | 2004 128933 | 4/2004 |
| JP | 2004 356835 | 12/2004 |

OTHER PUBLICATIONS

International Search Report dated May 30, 2006 with English translation.
P. Kenington, "High-Linearity RF Amplifier Design," Artech House Inc., www.artechhouse.com, ISBN 1-58053-143-1, Table of Contents and pp. 426-443, 2000.

* cited by examiner

*Primary Examiner*—Joseph Chang
(74) *Attorney, Agent, or Firm*—Dickinson Wright, PLLC

(57) ABSTRACT

Transmission apparatus capable of reducing distortion of the vector modulation wave that is the transmission output to a sufficiently small level is provided. An amplifying section (105) generates a vector modulation wave based on an amplitude component modulation signal and a phase modulation wave. A synchronous demodulating section (107) detects the vector modulation wave, generates a synchronous demodulation signal, and sends this to a band filtering section (108). The band filtering section (108) extracts a signal of the frequency component of the distortion from a synchronous demodulation signal outputted by the synchronous demodulating section (107). A controlling section (109) then refers to the distortion component signal extracted by the band filtering section (108), controls a delay time adjusting section (103) in such a manner that the signal level of the distortion component becomes small, adjusts a delay time difference between the amplitude component modulation signal and the phase component modulation signal, and reduces distortion of the modulation wave.

6 Claims, 17 Drawing Sheets

TRANSMISSION APPARATUS, COMMUNICATION APPARATUS AND MOBILE RADIO APPARATUS

BACKGROUND OF THE INVENTION

1. Field of the Invention

The present invention relates to transmission apparatus carrying out polar modulation so as to generate a vector modulation wave. More particularly, the present invention relates to transmission apparatus synthesizing an amplitude component modulation signal and phase modulation wave so as to generate a vector modulation wave, and communication apparatus and mobile wireless apparatus mounted with this transmission apparatus.

2. Description of the Related Art

Normally, a power amplifier provided at an output section of transmission apparatus in a wireless communication system requires both low distortion and high efficiency. Power amplifiers serving this kind of use are classified into amplifiers using transistors as a current source or using transistors as switches. Amplifiers using transistors as a current source may be class A amplifiers, class AB amplifiers, class B amplifiers and class C amplifiers. Further, amplifiers using transistors as a switch may be class D amplifiers, class E amplifiers and class F amplifiers.

Conventionally, class A or class AB linear amplifiers are used in order to amplify envelope fluctuation components in a linear manner, as high-frequency power amplifiers amplifying modulation waves containing envelope fluctuation components. However, there is the drawback that the power efficiency of linear amplifiers is inferior compared to non-linear amplifiers such as C class to E class amplifiers. Because of this, in the event that a conventional linear amplifier is used as a mobile type wireless apparatus such as a mobile telephone or mobile information terminal using a battery as a power source, because a class A or class AB linear amplifier of large power consumption is used, there is the drawback that usage time is short. Further, in the event that a conventional linear amplifier is used as base station apparatus for a mobile communication system installed with a plurality of large power transmission apparatus, there is the drawback of inviting increase in size of the transmission apparatus and increased heat generation.

Here, transmission apparatus having a highly efficient transmission function, equipped with an amplitude phase component extraction section, amplitude signal processing section, phase modulating section, and non-linear amplifying section etc. and carrying out polar modulation are well-known. EER (Envelope Elimination and Restoration) transmission apparatus configured so that a signal of a constant envelope level is received at a non-linear amplifying section that employs a non-linear amplifier of superior efficiency as a high-frequency amplifier, is proposed as this kind of transmission apparatus. Further, apparatus where non-linearity of an envelope signal for a non-linear amplifier is corrected using negative feedback so as to suppress amplitude distortion (Peter B. Kenington, "IGH-LINEARITY RF AMPLIFIER DESIGN," volume 1, ARTECH HOUSE, INC., 2000, p. 426-443) are well known as transmission apparatus.

FIG. 1 is a block diagram showing an example configuration of conventional EER transmission apparatus. This EER transmission apparatus employs a configuration comprised of transmission data signal input terminal 11, amplitude phase component extraction section 12, amplitude signal processing section 13, phase modulating section 14, non-linear amplifying section 15 and transmission output terminal 16. In FIG. 1, transmission data signal Si(t) inputted by transmission data signal input terminal 11 is defined by the following equation (1):

$$Si(t)=a(t)\times\exp[j\times\phi(t)] \quad (1)$$

Here, a(t) is an amplitude component modulation signal and φ(t) is a phase component modulation signal.

When transmission data signal Si(t) is defined as described in above equation (1), amplitude component modulation signal a(t) and phase component modulation signal φ(t) are extracted from transmission data signal Si(t) by amplitude phase component extraction section 12. The power supply voltage value of non-linear amplifying section 15 is then set via amplitude signal processing section 13 by this amplitude component modulation signal a(t). On the other hand, a phase modulation wave Sc(t) that is a carrier wave having an angular frequency ωc phase-modulated by phase modulating section 14 using a phase component modulation signal φ(t), is generated and inputted to non-linear amplifying section 15. The phase modulation wave Sc(t) at this time is expressed by the following equation (2):

$$Sc(t)=\exp[\omega c\times t+\phi(t)] \quad (2)$$

At the output of non-linear amplifying section 15, a signal that is power supply voltage a(t) of non-linear amplifying section 15 and a phase modulation wave Sc(t) that is an output signal of phase modulating section 804 multiplied together, is amplified by a gain G of non-linear amplifying section 15, and outputted as an RF (Radio Frequency) vector modulation wave Srf(t). Vector modulation wave Srf(t) at this time is expressed by the following equation (3):

$$Srf(t) = G \times a(t) \times Sc(t) \quad (3)$$
$$= G \times a(t) \times \exp[\omega c \times t + \varphi(t)]$$

As shown above, phase modulation wave Sc(t) inputted to non-linear amplifying section 15 is a phase modulation wave that is a modulation wave of a constant envelope level. It is therefore possible to use a non-linear amplifier of superior efficiency as a high-frequency amplifier, and, as a result, bring about a highly efficient and low distortion transmission apparatus. However, with the transmission apparatus shown in FIG. 1, in the event that there is a difference in delay time in the paths taken by the amplitude component and the phase component to reach non-linear amplifying section 15, distortion occurs in the vector modulation wave Srf(t) that is an output signal of non-linear amplifying section 15. For example, the signal transmitting the amplitude component is amplitude component modulation signal a(t) and the signal transmitting the phase component is phase component modulation signal φ(t) or phase modulation wave Sc(t), and there is a problem that delay times occur in the paths these signals are transmitted on.

FIG. 2 is a characteristic diagram showing the relationship between the frequency and amplitude of a vector modulation wave of the transmission apparatus shown in FIG. 1, with FIG. 2A showing the case where there is no difference in delay time, and FIG. 2B showing the case where there is a difference in delay time. Namely, FIG. 2 is a graph showing a frequency spectrum for vector frequency Srf(t) that is an output signal of non-linear amplifying section 15 of the transmission apparatus of FIG. 1. If there is a difference in delay time in the paths the amplitude component and phase component take to reach non-linear amplifying section 15, as shown in FIG. 2A, broadening of the frequency spectrum cannot be seen. However, when there is a difference in delay time in the paths the amplitude component and phase component reach the non-linear amplifying section 15 by, as shown in FIG. 2B, distortion of the vector modulation wave Srf(t) shown in FIG. 2B can be observed as broadening of the frequency spectrum. In a frequency division multiplex communication system where a plurality of channels are arranged on a frequency axis, this kind of broadening of the frequency spectrum causes interference with neighboring channels and therefore is not desirable.

Technology for removing distortion of vector modulation wave Srf(t) has therefore been proposed (for example, refer to Patent Document 1 (U.S. Pat. No. 6,366,177B1)). FIG. 3 is a block diagram showing a configuration for Conventional EER transmission apparatus such as Japanese Patent Document 1 etc. for improving distortion of vector modulation waves. Namely, FIG. 3 is a block diagram showing a configuration for transmission apparatus equipped with a function for correcting a difference in delay time occurring in paths the amplitude component and phase component take to reach non-linear power amplifying section 28. This transmission apparatus is comprised of transmission data input terminal 21, polar coordinate component modulation signal generating section 22 forming a modulation signal of an amplitude component and a phase component, timing correcting section 23, band-limiting filters 24 and 25, amplitude controlling section 26, phase modulating section 27, power amplifying section 28, transmission output terminal 29, phase angle measuring section 30, amplitude measuring section 31, and correction data storing section 32.

Next, a description is given of the operation of the transmission apparatus shown in FIG. 3. In addition to the same operation as the transmission apparatus shown in FIG. 1, this transmission apparatus selects correction data according to results of referring to an amplitude component and phase component of vector modulation wave Srf(t) that is the output signal of power amplifying section 28, and corrects and controls amplitude controlling section 26 and phase modulating section 27. Namely, the difference in delay time between the amplitude component and the phase component is known by again extracting and referring to the amplitude component and the phase component from the vector modulation wave Srf(t) and subjecting amplitude controlling section 26 and phase modulating section 27 to control corresponding to the correction of this difference. Further, timing correcting section 23 performs correction and control, and it is possible to directly adjust the time relationship between the amplitude component modulation signal a(t) and the phase component modulation signal φ(t).

From the above kind of correction control, adjustment is performed so as to cancel out differences between delay time occurring in paths the amplitude component and phase component take to reach power amplifying section 28 and distortion of the vector modulation wave Srf(t) that is the output of power amplifying section 28 can be achieved.

However, at the conventional transmission apparatus shown in FIG. 3, a difference in measured processing time occurs due to the respective functions between phase angle measuring section 30 and amplitude measuring section 31 being fundamentally different. As a result, the drawback occurs that it is not possible to measure the delay time between the amplitude component and the phase component in a precise manner.

It is necessary for phase angle measuring section 30 to function as a frequency discriminator that is a demodulator for a PM (Phase Modulation) modulation wave and an FM (Frequency Modulation) wave and is comprised of, for example, a pulse count detector circuit and a low pass filter circuit etc. With regards to this, it is necessary for amplitude measuring section 31 to function as an envelope detector that is a demodulator for AM (Amplitude Modulation) modulation waves and is comprised of, for example, a diode detector circuit and a low pass filter circuit, etc. Because of this, differences occur in measurement processing time due to differences in the circuit configuration of both circuits and it is therefore not possible to measure delay time in a precise manner.

In this manner, measurement processing time differences caused by differences in circuit configuration and differences in required performance etc. occur between phase angle measuring section 30 and amplitude measuring section 31. It is therefore not possible to accurately measure differences in delay time between the amplitude component and the phase component. Because of this, it is difficult to reduce distortion of vector modulation wave Srf(t) that is the output of power amplifying section 28 to a sufficiently small level.

SUMMARY OF THE INVENTION

It is therefore an object of the present invention to provide transmission apparatus capable of appropriately adjusting a delay time difference between an amplitude component and a phase component so as to reduce distortion of a vector modulation wave that is a transmission output to a sufficiently small level.

In a first aspect of transmission apparatus of the present invention, a configuration is adopted where transmission apparatus synthesizing an amplitude component and a phase component using polar modulation and generating and transmitting a vector modulation wave has: a polar coordinate component modulation signal generating section that forms an amplitude component modulation signal and a phase component modulation signal based on an input signal; a delay time adjusting section that changes a delay time difference between the amplitude component modulation signal and the phase component modulation signal; a phase modulating section that forms a phase modulation wave where a carrier wave is phase-modulated by the phase component modulation signal; an amplifying section that, receiving as input the phase modulation wave at a signal input terminal of the transmission apparatus, with the amplitude component modulation signal applied to a power supply voltage terminal of the transmission apparatus, forms a vector modulation wave where the phase modulation wave is amplitude-modulated by the amplitude component modulation signal; a synchronous demodulating section that synchronously demodulates the vector modulation wave and forms a synchronous demodulation signal; a band filtering section that extracts and outputs a signal of a specific frequency component contained in the synchronous demodulation signal; and a controlling section that controls the delay time adjusting section in such a manner that the level of the output signal of the band filtering section becomes small.

According to this configuration, by synchronously demodulating the modulation wave without dividing and extracting an amplitude component and phase component from the modulation wave, it is possible to detect distortion of the modulation wave occurring due to delay time differences between the amplitude component and the phase component, and carry out correction control on the delay time difference of the amplitude component modulation signal and the phase component modulation signal based on the detection results, so that it is possible to reduce distortion of the modulation wave down to a sufficiently small level.

A further aspect of transmission apparatus of the present invention is such that the polar coordinate component modulation signal generating section is comprised of: an in-phase/quadrature component modulation signal generating section that forms the in-phase component modulation signal and the quadrature component modulation signal; and a coordinate converting section that forms an amplitude component modulation signal and phase component modulation signal based on the in-phase component modulation signal and the quadrature component modulation signal, the in-phase/quadrature component modulation signal generating section forms a first sine wave signal having a first frequency f1 and a first phase angle p1 as the in-phase component modulation signal and a second sine wave signal having a frequency that is the same as the first frequency of f1 and a second phase angle p2 where the difference with the first phase angle p1 is not an integer multiple of ninety degrees, as the quadrature component modulation signal, the band filtering section extracts a signal of a frequency component that is the second frequency f2 expressed by a value that is n times the first frequency f1, where the value of n is an odd number of three or more.

According to this configuration, a signal is generated by the polar coordinate component modulation signal generating section in such a manner that a distortion component appears at a frequency component that is the second frequency f2 expressed by a value that is n (where n is an odd number of three or more) times the first frequency f1 in the event that a difference in delay time occurs in the paths the amplitude component modulation signal and phase component take to reach the amplifying section. The second frequency f2 is then extracted by the band filtering section. The controlling section also then controls the delay time adjusting section in such a manner that the level of the output signal of the band filtering section becomes small. It is therefore possible to reliably correct and control the delay time difference between the amplitude component modulation signal and the phase component modulation signal in the event of differences in delay time between the paths the amplitude component modulation signal and the phase component take to reach the amplifying section.

In a further aspect of a transmission apparatus of the present invention, the polar coordinate component modulation signal generating section is provided with: an in-phase/quadrature component modulation signal generating section that forms the in-phase component modulation signal and the quadrature component modulation signal; and a coordinate converting section that forms an amplitude component modulation signal and phase component modulation signal based on the in-phase component modulation signal and the quadrature component modulation signal, the in-phase/quadrature component modulation signal generating section adds a first sine wave signal of a first frequency f1 and having a first phase angle p1 and a second sine wave signal of the second frequency f2 having the first phase angle p1 and forms a signal as the in-phase component modulation signal, and adds a third sine wave signal of the same frequency as the first frequency f1 and having a second phase angle p2 where a difference with the first phase angle p1 is an odd multiple of ninety degrees, and a fourth sine wave signal having the same frequency as the second frequency f2 and the second phase angle p2 and forms a signal as the quadrature component modulation signal, the band filtering section extracts a signal of a frequency component that is the third frequency f3 expressed by the sum of a value that is n times the first frequency f1 and a value that is (n+1) times the second frequency f2, where the value of n is an odd number of one or more.

According to this configuration, a signal is generated by the polar coordinate component modulation signal generating section in such a manner that a distortion component appears at a frequency component that is a third frequency f3 expressed by the sum of a value that is n times the first frequency f1 and a value that is (n+1) times the second frequency f2 in the event that a difference in delay time occurs in the paths the amplitude component modulation signal and phase component take to reach the amplifying section. The third frequency f3 is then extracted by the band filtering section. The controlling section also then controls the delay time adjusting section in such a manner that the level of the output signal of the band filtering section becomes small. It is therefore possible to reliably correct and control the delay time difference between the amplitude component modulation signal and the phase component modulation signal in the event of differences in time delay between the paths the amplitude component modulation signal and the phase component take to reach the amplifying section.

BRIEF DESCRIPTION OF THE DRAWINGS

The above and other objects and features of the invention will appear more fully hereinafter from a consideration of the following description taken in connection with the accompanying drawings, in which:

FIG. 2 is a characteristic diagram showing a frequency spectrum of vector modulation wave Srf(t) where

FIG. 7 is a comparative example illustrating the operation of polar coordinate component modulation signal generating section 310 of FIG. 6, where

FIG. 8 is a characteristic diagram illustrating the operation of polar coordinate component modulation signal generating section 310 of FIG. 6, where

FIG. 9 is a characteristic diagram showing a frequency spectrum of a synchronous demodulation signal, where

FIG. 11 is a characteristic diagram illustrating the operation of sine wave generating sections 401 and 402, phase shifting sections 403 and 404, and adding sections 405 and 406 of FIG. 10, where

FIG. 12 is a characteristic diagram showing a frequency spectrum of a synchronous demodulation signal, where

FIG. 15 is a characteristic diagram showing a frequency spectrum of vector modulation that is an output signal of the amplifying section 105 of the fifth embodiment, where

FIG. 17 is a characteristic diagram showing a frequency spectrum of vector modulation wave that is an output signal of the amplifying section 105 of the sixth embodiment, where

DETAILED DESCRIPTION OF THE PREFERRED EMBODIMENT

The following is a detailed description with reference to the drawings of preferred embodiments of the present invention.

First Embodiment

Figure 4:
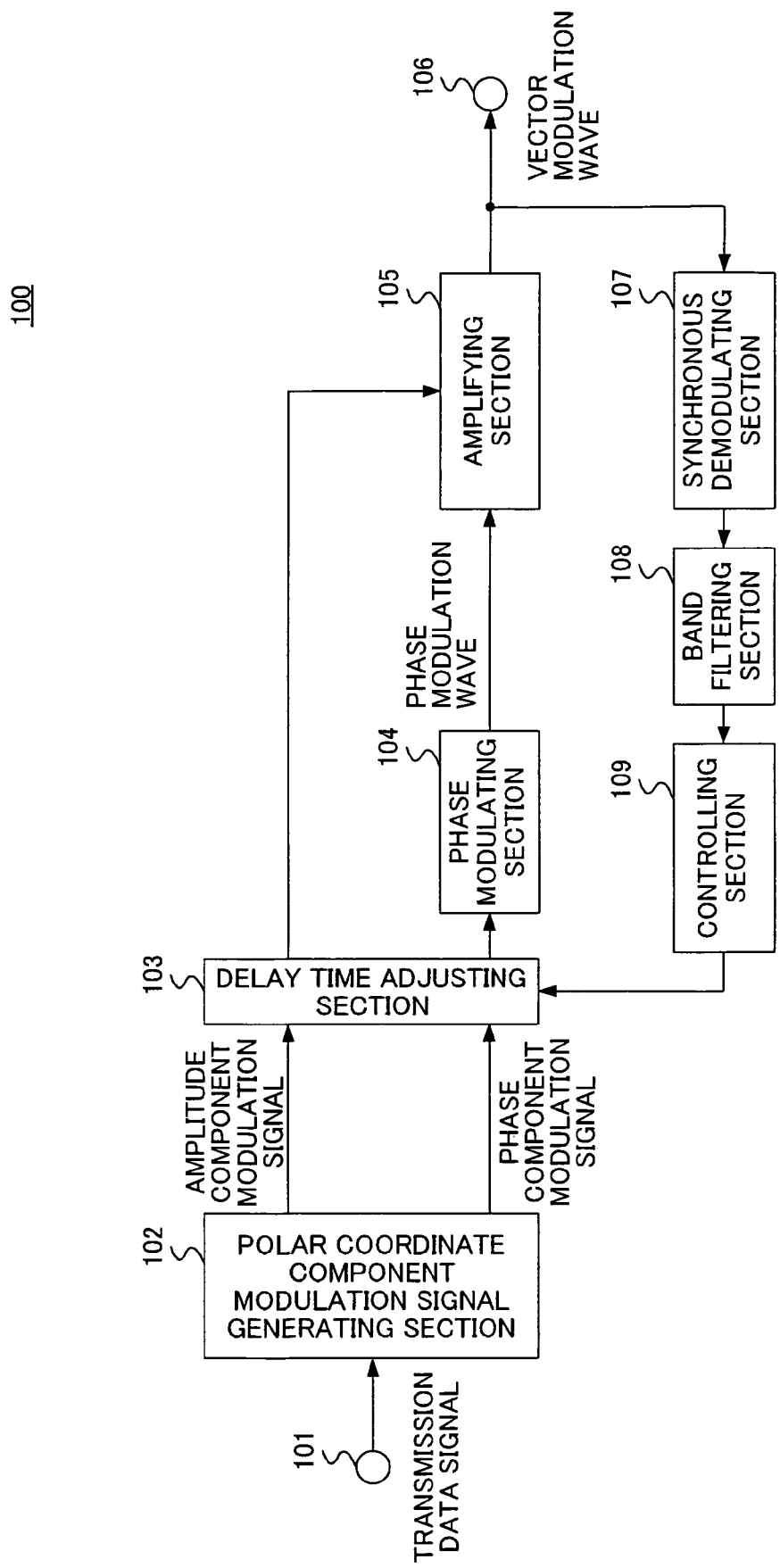
FIG. 4 is a block diagram showing a configuration for a transmission apparatus according to a first embodiment of the present invention.

FIG. 4 is a block diagram showing a configuration for a transmission apparatus of a first embodiment of the present invention. Transmission apparatus 100 shown in FIG. 4 is comprised of transmission data signal input terminal 101 inputting a transmission data signal, polar coordinate component modulation signal generating section 102 forming an amplitude component modulation signal and a phase component modulation signal based on an inputted transmission data signal, delay time adjusting section 103 changing the delay time of an amplitude component modulation signal and a phase component modulation signal, phase modulating section 104 forming a phase modulation wave where a carrier wave is phase-modulated by the phase component modulation signal, amplifying section 105 receiving as input the phase modulation wave at a signal input terminal of transmission apparatus 100, with the amplitude component modulation signal applied to a power supply voltage terminal of transmission apparatus 100, forming a vector modulation wave where the phase modulation wave is amplitude-modulated by the amplitude component modulation signal, transmission output terminal 106 outputting a vector modulation wave, synchronous demodulating section 107 synchronously demodulating the vector modulation wave and forming a synchronous demodulation signal, band filtering section 108 extracting and outputting a specific frequency component the synchronous demodulation signal contains, and controlling section 109 controlling delay time adjusting section 103 in such a manner that the level of the output signal of band filtering section 108 becomes small.

Next, a description is given of the operation of transmission apparatus 100 of a first embodiment shown in FIG. 4. Polar coordinate component modulation signal generating section 102 forms an amplitude component modulation signal and phase component modulation signal based on a transmission data signal inputted by transmission data signal input terminal 101, and supplies the amplitude component modulation signal to amplifying section 105 via delay time adjusting section 103 as a power supply voltage. On the other hand, the phase component modulation signal is inputted to phase modulating section 104 via delay time adjusting section 103. In doing so, phase modulating section 104 forms a phase modulation wave by subjecting a carrier wave to phase modulation using a phase component modulation signal and transmits this phase modulation wave to amplifying section 105.

Amplifying section 105 is a high-frequency amplifier equipped with a semiconductor amplifier element. At this amplifying section 105, a phase modulation wave from phase modulating section 104 and an amplitude component modulation signal that is the power supply voltage are multiplied together, and an RF signal amplified by a predetermined gain is outputted as a vector modulation signal from transmission output terminal 106. At this time, amplifying section 105 is capable of carrying out non-linear amplification of superior efficiency because the input signal is a phase modulation wave of a constant envelope level.

Synchronous demodulating section 107 synchronously demodulates the vector modulation wave outputted by amplifying section 105, and forms a synchronous demodulation signal. Namely, synchronous demodulating section 107 forms a synchronous demodulation signal frequency-converted to the baseband by multiplying the vector modulation wave outputted by amplifying section 105 and a localized oscillation signal (local signal) having the same frequency as the center frequency of the vector modulation wave using a mixer circuit, and transmits this synchronous demodulation signal to band filtering section 108.

Figure 2A:
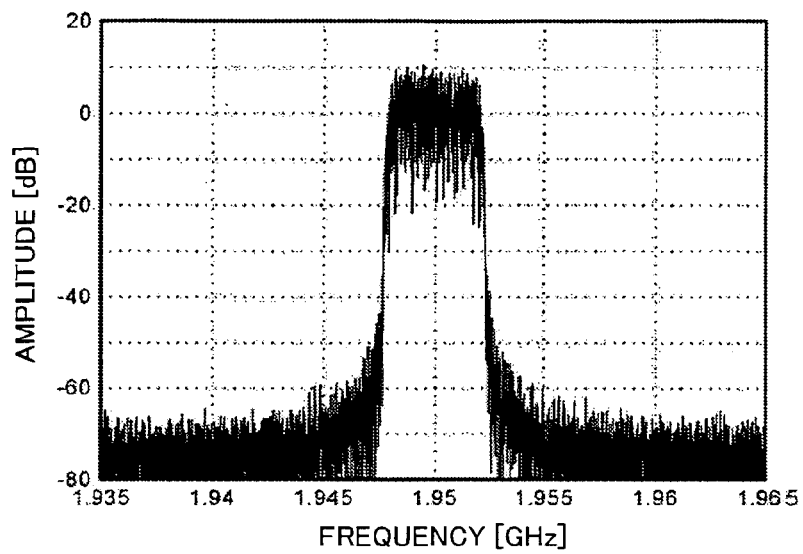
FIG. 2A is a characteristic diagram showing a frequency spectrum in the case where a difference in delay time does not exist.
Figure 5:
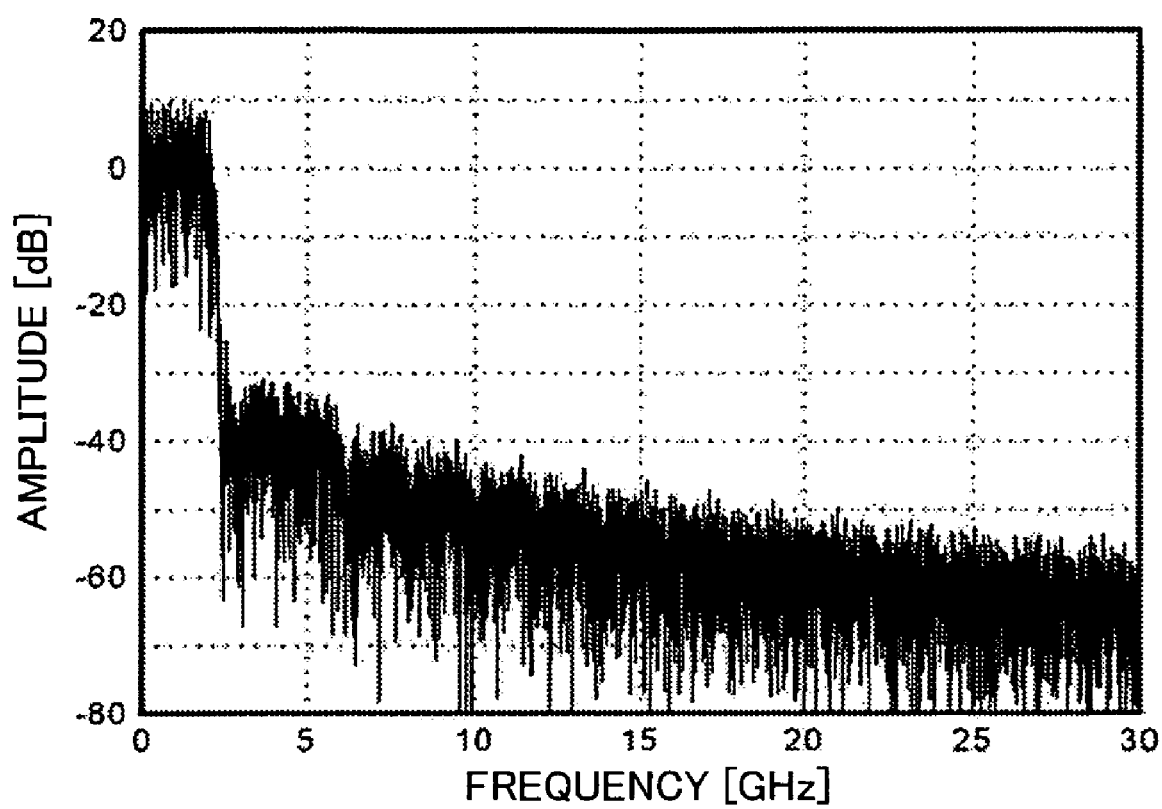
FIG. 5 is a characteristic diagram of a frequency spectrum for a synchronous demodulation signal outputted from a synchronous demodulation section of the transmission apparatus of FIG. 4.

FIG. 5 is a characteristic diagram showing the frequency spectrum of a synchronous demodulation signal outputted by synchronous demodulating section 107 in the transmission apparatus of FIG. 4, where the horizontal axis represents frequency (MHz) and the vertical axis represents amplitude (dB) of the synchronous demodulation signal. Namely, when there is a difference in delay time for the paths that the amplitude component and the phase component take to reach amplifying section 105, as with the case where the vector modulation wave shown in FIG. 2 described previously, the characteristic of the synchronous demodulation signal becomes as shown in FIG. 5.

As can be understood from FIG. 5, in the event that there is a difference in delay time for the paths the amplitude component and the phase component take to reach amplifying section 105, the synchronous demodulation signal outputted from synchronous demodulating section 107 maintains information about distortions (broadening of the frequency spectrum shown in FIG. 5) occurring in the vector modulation wave outputted by amplifying section 105.

There, band filtering section 108 extracts a signal of the frequency component for distortion from a synchronous demodulation signal outputted by synchronous demodulating section 107, controlling section 109 refers to the distortion component signal extracted by band filtering section 108 and controls delay time adjusting section 103 in such a manner that the signal level of this distortion component becomes small, and the delay time difference between the amplitude component modulation signal and the phase component modulation signal is adjusted.

The purpose of the delay time adjustment is achieved by, for example, controlling section 109 controlling delay time adjusting section 103 and storing the value for the delay time with which the signal level of the distortion component extracted by band filtering section 108 is a minimum in memory as necessary while changing the delay time of the amplitude component modulation signal a little at a time, with the stored value then being set as a value for the delay time provided to delay time adjusting section 103 at the time of completion of change in the delay time within a certain fixed range.

Namely, amplifying section 105 generates a vector modulation wave based on the amplitude component modulation signal and phase modulation wave, but in the event that there is a difference in delay time in the paths the amplitude component and the phase component take to reach amplifying section 105, synchronous demodulating section 107 detects the vector modulation wave, forms a synchronous demodulation signal, and transmits this to band filtering section 108. In doing so, band filtering section 108 extracts the signal of the frequency component of distortion from the synchronous demodulation signal inputted by synchronous demodulating section 107, and controlling section 109 refers to the distortion component signal extracted by band filtering section 108 and controls the delay time adjusting section 103 in such a manner that the signal level of this distortion component becomes small, and the delay time difference between the amplitude component modulation signal and the phase modulation signal is adjusted so as to reduce distortion in the modulation wave. By this means, it is possible to reduce distortion of the vector modulation wave that is the transmission output, to a sufficiently small level.

In this manner, at the transmission apparatus of the first embodiment of the present invention, it is possible to detect distortion of a modulation wave occurring as a result of delay time differences between the amplitude component and the phase component by synchronously demodulating a vector modulation wave without separating and extracting the amplitude component and the phase component from the vector modulation wave, and delay time differences between the amplitude component modulation signal and the phase component modulation signal are corrected and controlled based on these detection results, so that it is possible to reduce the distortion of the vector modulation wave down to a sufficiently small level.

Second Embodiment

Figure 6:
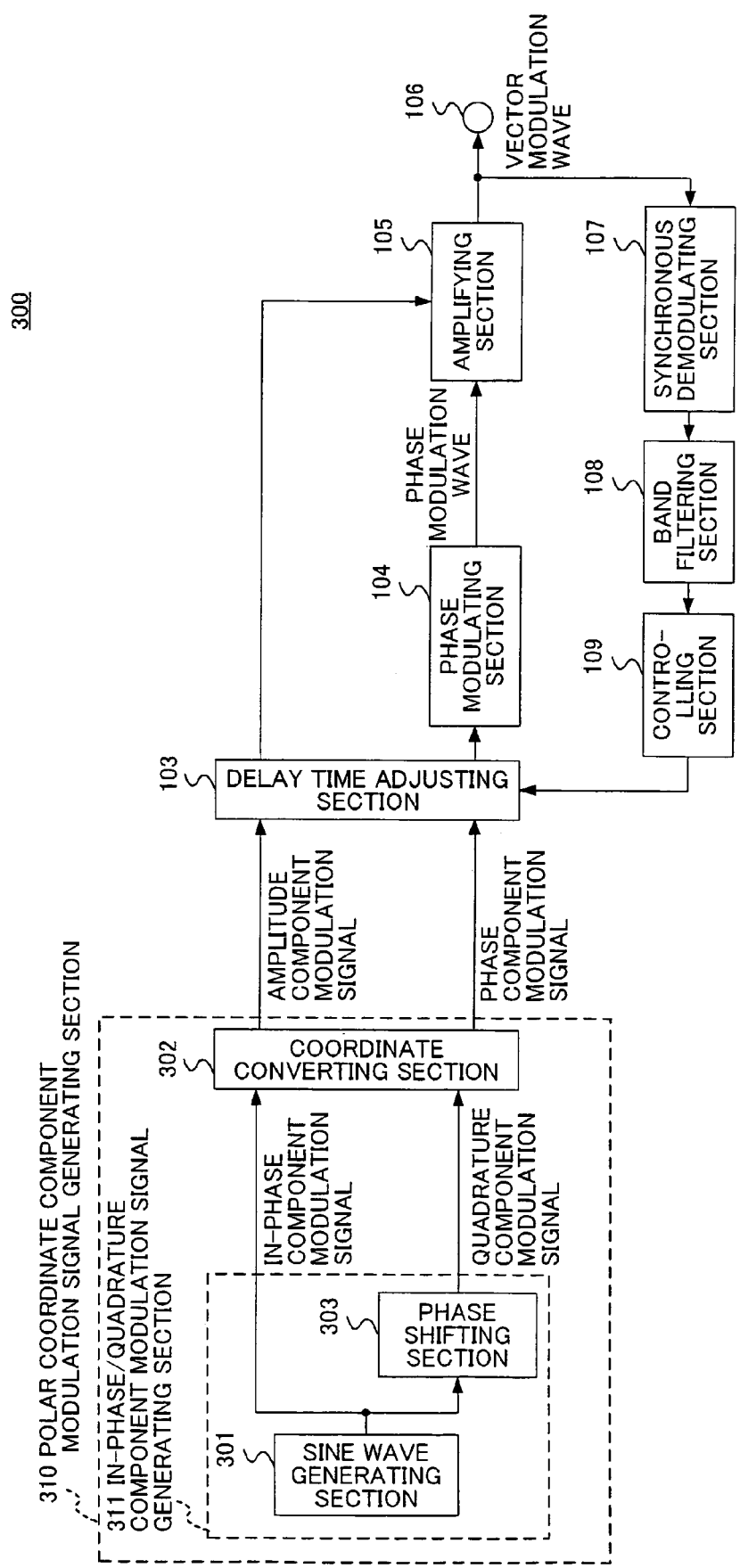
FIG. 6 is a block diagram showing a configuration for a transmission apparatus according to a second embodiment of the present invention.

FIG. 6 is a block diagram showing a configuration for transmission apparatus of this embodiment. In FIG. 6, components that are the same as in FIG. 4 described in the first embodiment are given the same numerals and description thereof is omitted. Polar coordinate component modulation signal generating section 310 of transmission apparatus 300 of this embodiment is comprised of in-phase/quadrature component modulation signal generating section 311 and polar coordinate converting section 302. Further, in-phase/quadrature component modulation signal generating section 311 has sine-wave generating section 301 and phase shifting section 303.

In the case of this embodiment, in-phase/quadrature component modulation signal generating section 311 forms a first sine wave signal, as an in-phase component modulation signal, having a first frequency f1 and a first phase angle p1, and a second sine wave signal, as a quadrature component modulation signal, having a frequency that is the same as the first frequency of f1 and a second phase angle p2 where the difference with the first phase angle p1 is not an integer multiple of ninety degrees, using sine-wave generating section 301 and phase shifting section 303.

Specifically, in-phase/quadrature component modulation signal generating section 311 sends the first sine wave of frequency f1 generated by sine wave generating section 301 to coordinate converting section 302 as an in-phase component modulation signal, and the sine wave of frequency f1 generated by sine-wave generating section 301 is phase-shifted by phase shifting section 303 and is sent to coordinate converting section 302 as the quadrature component modulation signal. At this time, phase shifting section 303 shifts the phase of the sine wave in such a manner that the difference between the phase angle p2 of the quadrature component modulation signal and the phase angle p1 of the in-phase component modulation signal does not become an integer multiple of ninety degrees.

Coordinate converting section 302 forms an amplitude component modulation signal and a phase component modulation signal from the in-phase component modulation signal and the quadrature component modulation signal, and these are sent to delay time adjusting section 103.

Next, a description is given of the operation of transmission apparatus 300 of a second embodiment shown in FIG. 6. The in-phase component modulation signal I(t) and quadrature component modulation signal Q(t) inputted to coordinate converting section 302 are typically referred to as the I (In-phase) component modulation signal and Q (Quadrature) component modulation signal. The in-phase component modulation signal I(t) and quadrature component modulation signal Q(t) are signals expressing transmission data signal Si(t) in the form of Cartesian coordinates. AC artesian coordinate is also referred to as an IQ coordinate or XY coordinate.

Coordinate converting section 302 forms amplitude component modulation signal a(t) and phase component modulation signal φ(t) expressed using polar coordinates from in-phase component modulation signal I(t) and quadrature component modulation signal Q(t) expressed in the form of Cartesian coordinates. At this time, amplitude component modulation signal a(t) is expressed by the following equation (4), and phase component modulation signal φ(t) is expressed by the following equation (5).

$$a(t)=[\{I(t)\}^2+\{Q(t)\}^2]^{1/2} \quad (4)$$

$$\phi(t)=\tan^{-1}\{Q(t)/I(t)\} \quad (5)$$

In-phase/quadrature component modulation signal generating section 311 forms a signal expressed by the following equation (6) as a sine wave signal having a frequency f1 and phase angle p1 as an in-phase component modulation signal I(t). A signal expressed by the following equation (7) is formed as a sine wave signal having frequency f1 and phase angle p2 as a quadrature component modulation signal Q(t).

$$I(t)=\sin(2\pi \times f1 \times t+p1) \quad (6)$$

$$Q(t)=\sin(2\pi \times f1 \times t+p2) \quad (7)$$

Here, phase angle p1 and phase angle p2 are such that the difference between their values does not have a value of an integer multiple of ninety degrees. In the event that the difference between phase angle p1 and phase angle p2 is, for example, ninety degrees, the amplitude component modulation signal a(t) outputted from coordinate converting section 302 becomes a fixed value. Therefore, even if the time relationship between amplitude component modulation signal a(t) and phase component modulation signal φ(t) changes, the phase modulation wave is multiplied with the amplitude component modulation signal that is a fixed value at amplifying section 105, so that the vector modulation wave outputted by amplifying section 105 does not change and, as a result, distortion does not occur. Taking this into consideration, in this embodiment, it is ensured that the difference between phase angle p1 and phase angle p2 does not become an integer multiple of ninety degrees.

Figure 7A:
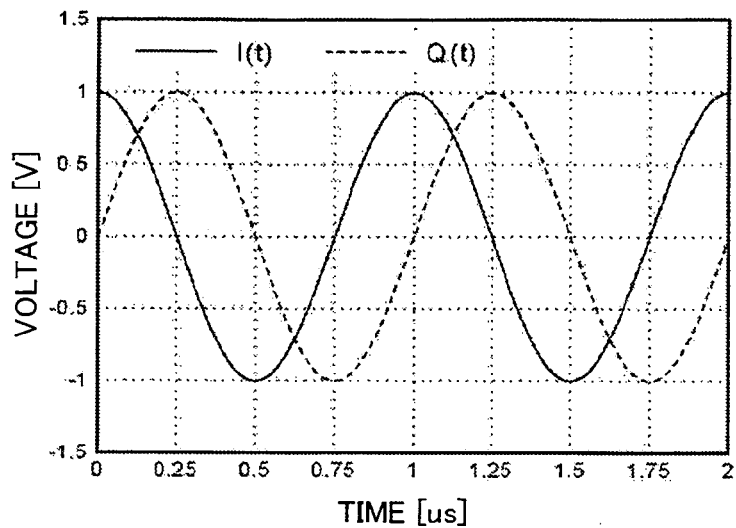
FIG. 7A is a diagram showing a time waveform for I(t) and Q(t) for the case where a difference in phase angle is ninety degrees.
Figure 7B:
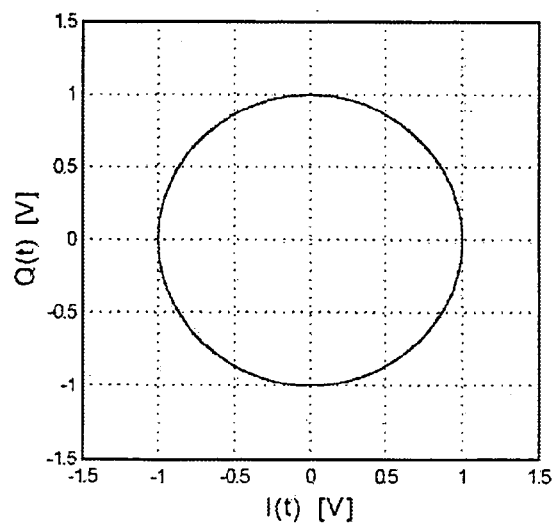
FIG. 7B is a diagram showing a constellation depicted with I(t) and Q(t) in the event that the difference in phase angle is ninety degrees.

FIG. 7 is a characteristic diagram illustrating the operation of polar coordinate component modulation signal generating section 310 of this embodiment. FIG. 7 is a characteristic diagram illustrating characteristics of transmission apparatus of a second embodiment of the present invention, with the conditions that are different for this second embodiment of the present invention being the difference of the phase angle p1 and phase angle p2, i.e. a characteristic diagram showing in-phase component modulation signal I(t) and quadrature component modulation signal Q(t) in the event that (p2-p1) is, for example, ninety degrees. FIG. 7A expresses the time [µS] on the horizontal axis, the voltage (V) of the in-phase component modulation signal I(t) and quadrature component modulation signal Q(t) on the vertical axis, and shows a time waveform for I(t) and Q(t). Further, FIG. 7B shows voltage (V) of in-phase component modulation signal I(t) on the horizontal axis, shows voltage (V) of quadrature component modulation signal Q(t) on the vertical axis, and shows a constellation depicted with I(t) and Q(t). The characteristic diagram of FIG. 7B is also referred to as a signal space diagram.

As is clear from equation (4) described above, amplitude component modulation signal a(t) corresponds to the distance between the origin (center of the circle) and coordinates (I(t), Q(t)) in the constellation as in FIG. 7B. In the constellation of FIG. 7B, it can be understood that a locus of coordinates (I(t), Q(t)) where the phase difference of in-phase component modulation signal I(t) and quadrature component modulation signal Q(t) is ninety degrees, depicts a circle, and amplitude component modulation signal a(t) is usually a fixed value. At the transmission apparatus 300 of this embodiment, an in-phase component modulation signal and a quadrature component modulation signal are formed by sine-wave generating section 301 and phase shifting section 303 in such a manner that the difference of the phase angle p1 and phase angle p2 does not become an integral multiple of ninety degrees.

FIG. 8 is a characteristic diagram illustrating the operation of polar coordinate component modulation signal generating section 310 of this embodiment. FIG. 8 is a characteristic diagram showing in-phase component modulation signal I(t) and quadrature component modulation signal Q(t) in the event that in-phase/quadrature component modulation signal generating section 311 of this embodiment is such that the difference of phase angle p1 and phase angle p2 is not an integer multiple of ninety degrees. FIG. 8 shows the case where the difference of phase angle p1 and phase angle p2 i.e. (p2-p1), is, for example, sixty degrees.

Figure 8A:
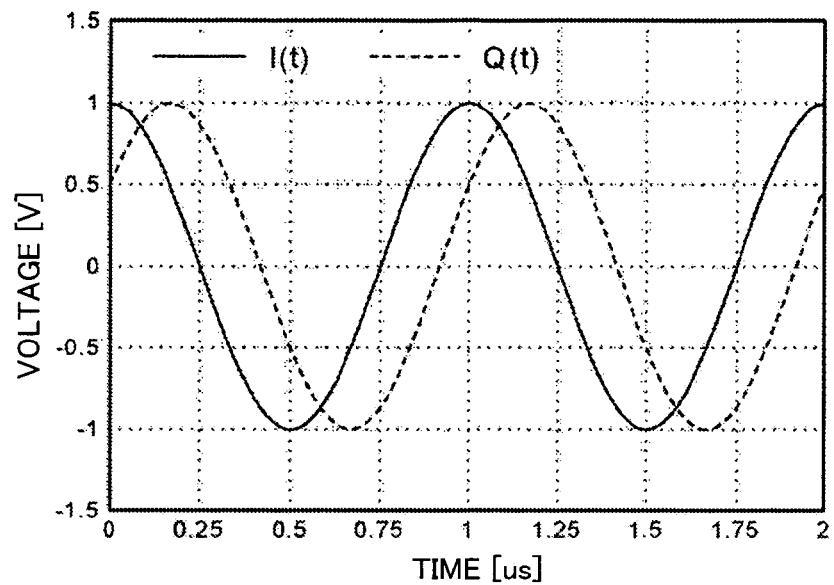
FIG. 8A is a diagram showing a time waveform for I(t) and Q(t) in the case (for the case of sixty degrees) where the difference in phase angle is not an integer multiple of ninety degrees)
Figure 8B:
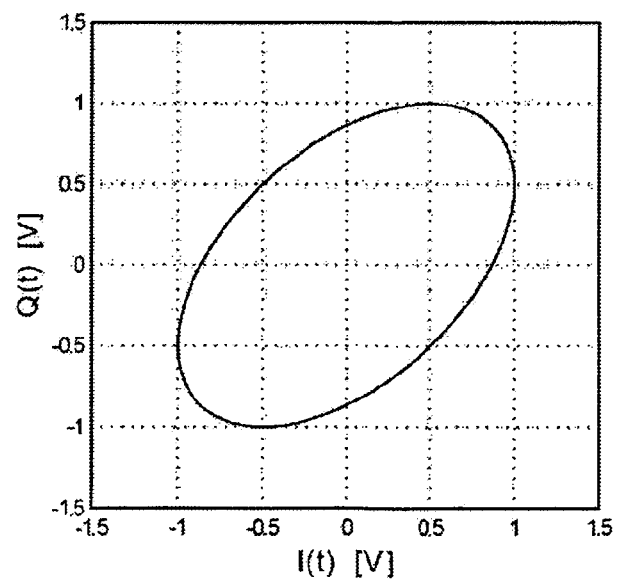
FIG. 8B is a diagram showing a constellation depicting I(t) and Q(t) for the case (the case of sixty degrees) where the difference in phase angle is not an integer multiple of ninety degrees.

FIG. 8A expresses the time [µS] on the horizontal axis, the voltage (V) of I(t) and Q(t) on the vertical axis, and shows a time waveform for I(t) and Q(t). Further, FIG. 8B shows the voltage (V) of I(t) on the horizontal axis, and the voltage (V) of Q(t) on the vertical axis, and shows a constellation depicted with I(t) and Q(t). Namely, in the constellation of FIG. 8B, it can be understood that a locus of coordinates (I(t), Q(t)) where the phase difference of in-phase component modulation signal I(t) and quadrature component modulation signal Q(t) is sixty degrees depicts an ellipse, and the value of amplitude component modulation signal a(t) changes with time.

Figure 9A:
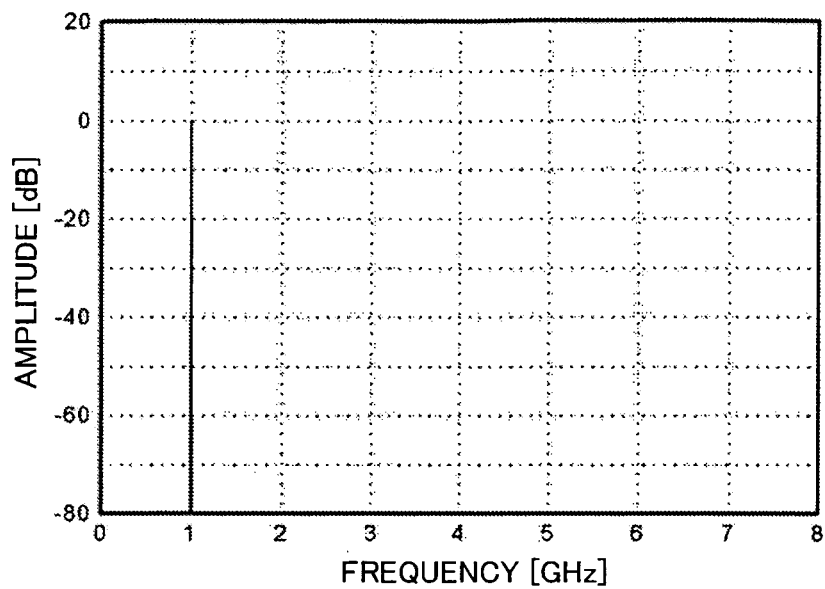
FIG. 9A is a diagram showing a frequency spectrum in the case where a difference in delay time does not exist.
Figure 9B:
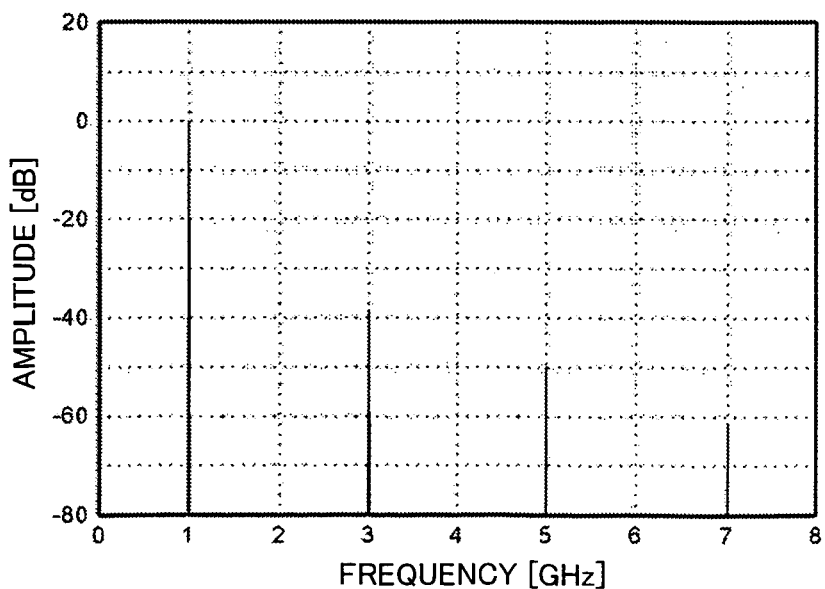
FIG. 9B is a diagram showing a frequency spectrum for the case where a difference in delay time does exist.

FIG. 9 is a characteristic diagram illustrating an operation of synchronous demodulating section 107 of transmission apparatus 300 of this embodiment. Specifically, FIG. 9 is a characteristic diagram showing a frequency spectrum of a synchronous demodulation signal that is the output signal of synchronous demodulating section 107. When there is no difference in the delay time for the paths the amplitude component modulation signal and the phase component take to reach amplifying section 105, as shown in FIG. 9A, only the 1 MHz component appears, and a distortion component does not occur. However, when there is a difference in delay time in the paths the amplitude component modulation signal and the phase component take to reach amplifying section 105, as shown in FIG. 9B, a distortion component occurs at 3 MHz, 5 MHz, and 7 MHz with respect to the sine wave of frequency of 1 MHz generated by sine-wave generating section 301. Namely, the value of these distortion frequency component have values that are odd-numbered multiples of three or more with respect to the frequency f1 of the sine wave generated by sine-wave generating section 301.

Band filtering section 108 extracts a signal of a frequency component that is a frequency f2 expressed by a value that is n times the frequency f1. The value of n may be any one value of the values that are odd numbers of three or more. Band filtering section 108 is configured as a so-called band-pass filter whereby a component of unit frequency f2 that is one of a frequency component of distortion occurring in a synchronous demodulation signal outputted from synchronous demodulating section 107 is extracted and other noise components and signal components of frequency f1 are suppressed. Other distortion components and the signal component of frequency f1 exist in frequencies isolated from the component for frequency f2, and suppression to a sufficiently low level is possible. It is therefore possible to precisely extract only the distortion component of frequency f2.

In this way, at transmission apparatus 300 of this embodiment, in-phase/quadrature component modulation signal generating section 311 generates a first sine wave signal having a first frequency f1 and having a first phase angle p1 being formed as an in-phase component modulation signal, and a second sine wave signal having a second phase angle p2 with the same frequency as the first frequency f1 as a quadrature component modulation signal, where the difference with the first phase angle p1 is not an integer multiple of ninety degrees, and band filtering section 108 extracts a signal of a frequency component that is the second frequency f2 expressed by a value that is n times (where n is an odd number of three or more) the first frequency f1, so that it is possible to detect distortion of the modulation wave in a precise manner and reduce distortion to a sufficiently small level.

Third Embodiment

Figure 10:
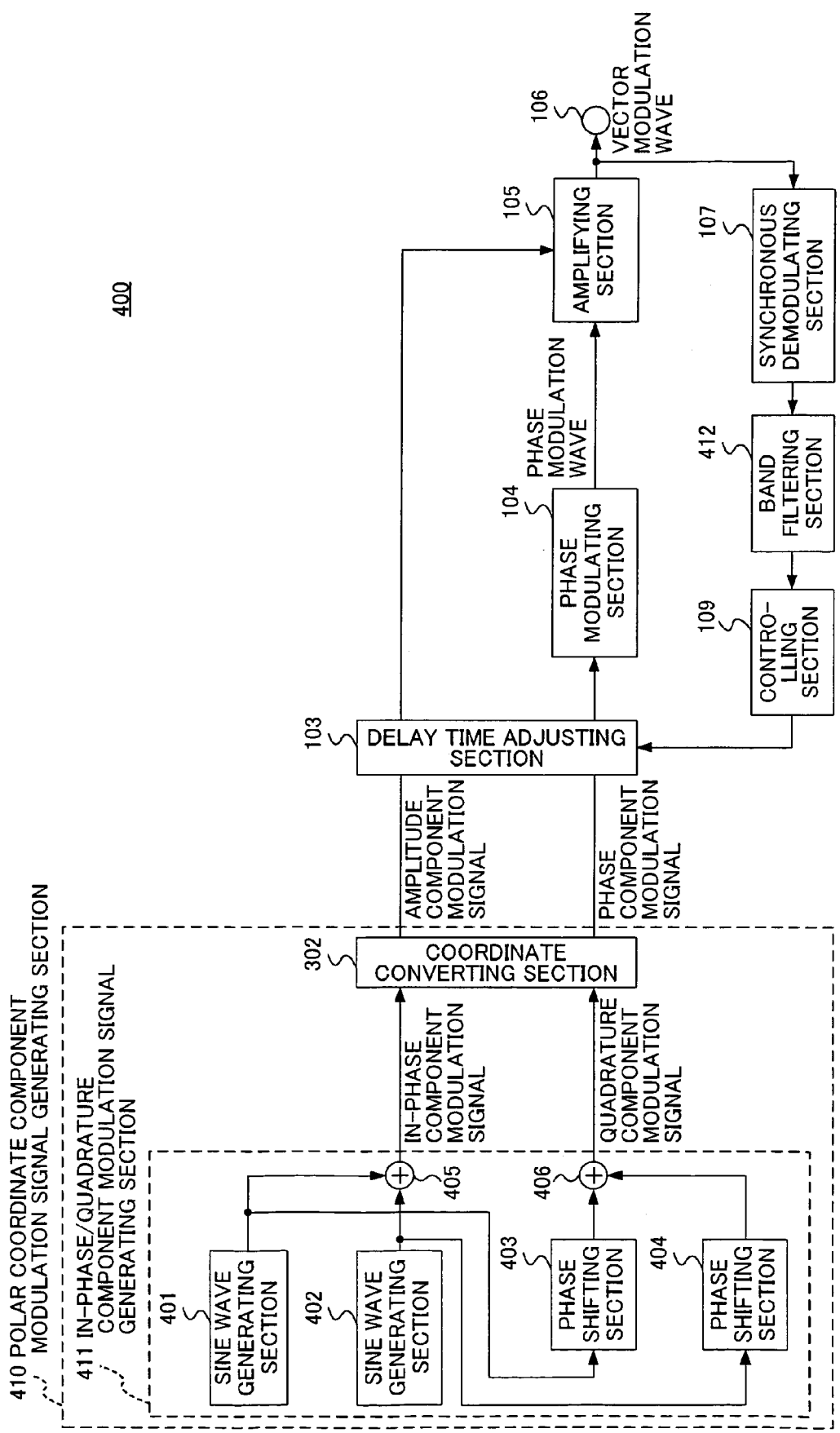
FIG. 10 is a block diagram showing a configuration for a transmission apparatus of a third embodiment of the present invention.

FIG. 10 shows a configuration for transmission apparatus of the present embodiment. Transmission apparatus 400 of this embodiment is different from transmission apparatus 300 of the second embodiment shown in FIG. 6 in that rather than having sine-wave generating section 301 and phase shifting section 303, in-phase/quadrature component modulation signal generating section 411 has sine wave generating sections 401 and 402, phase shifting sections 403 and 404, and adding sections 405 and 406.

Sine wave generating section 401 generates a sine wave of frequency f1 and transmits this to phase shifting section 403 and adding section 405. Sine wave generating section 402 generates a sine wave of frequency f2 that is different from frequency f1 and transmits this to phase shifting section 404 and adding section 405.

Phase shifting section 403 shifts and outputs the phase of the inputted sine wave in such a manner that the difference in the phase angle of the inputted sine wave and the outputted sine wave becomes an odd multiple of ninety degrees. Similarly, phase shifting section 404 shifts and outputs the phase of the inputted sine wave in such a manner that the difference in the phase angle of the inputted sine wave and the outputted sine wave becomes an odd multiple of ninety degrees.

By this means, a signal that is the sum of a sine wave signal having a frequency f1 and phase angle p1 and a sine wave signal having frequency f2 and phase angle p1 is outputted from adding section 405 as an in-phase component modulation signal. Further, a signal that is the sum of a sine wave signal having a frequency f1 and a phase angle p2 of with a difference with phase angle p1 that is an odd multiple of ninety degrees and a sine wave signal having a frequency f2 and a phase angle p2 is outputted from adding section 406 as a quadrature component modulation signal.

Namely, in-phase/quadrature component modulation signal generating section 411 forms a signal expressed by the following equation (8) as an in-phase component modulation signal I(t).

$$I(t)=a1\times\sin(2\pi\times f1\times t+p1)+a2\times\sin(2\pi\times f2\times t+p1) \quad (8)$$

Further, in-phase/quadrature component modulation signal generating section 411 forms a signal expressed by the following equation (9) as a quadrature component modulation signal Q(t).

$$Q(t)=a1\times\sin(2\pi\times f1\times t+p2)+a2\times\sin(2\pi\times f2\times t+p2) \quad (9)$$

Here, phase angle p1 and phase angle p2 are such that the difference between these values becomes a value of ninety degrees.

Figure 11A:
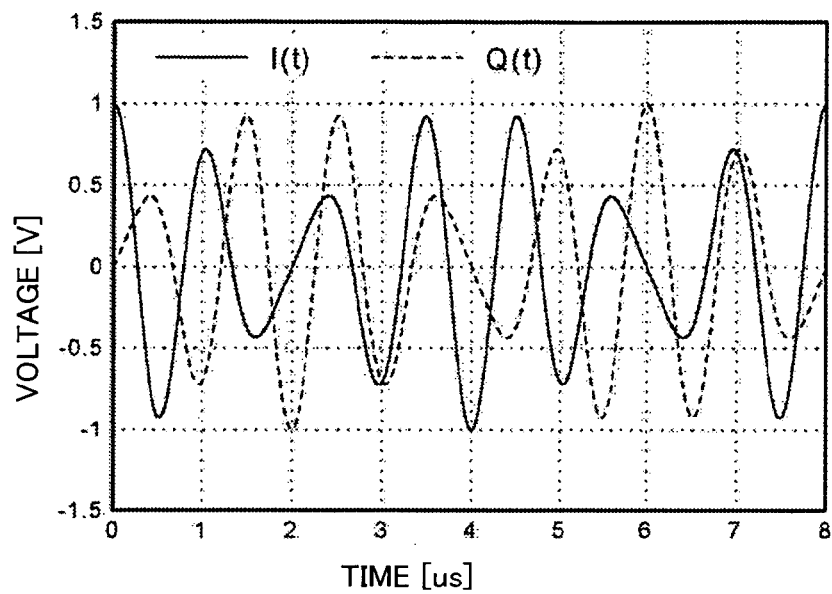
FIG. 11A is a diagram showing a time waveform for I(t) and Q(t) for the case where the ratio of frequency f1 and frequency f2 is 7:9 and the ratio of amplitude a1 and amplitude a2 is 2:1.
Figure 11B:
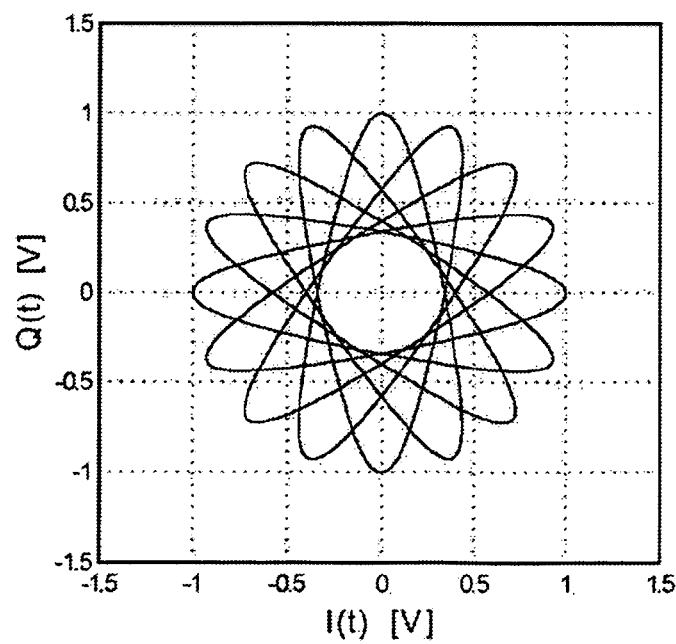
FIG. 11B is a diagram showing a constellation depicting I(t) and Q(t) for the case where the ratio of frequency f1 and frequency f2 is 7:9, and the ratio of amplitude a1 and amplitude a2 is 2:1.

FIG. 11 is a characteristic diagram illustrating the operation of polar coordinate component modulation signal generating section 410 of this embodiment. FIG. 11 is a graph showing in-phase component modulation signal I(t) and quadrature component modulation signal Q(t). In FIG. 11, the case where the ratio of frequency f1 and frequency f2 is 7:9, and the ratio of amplitude a1 and amplitude a2 is 2:1 is shown. FIG. 11A expresses the time [μS] on the horizontal axis, the voltage of I(t) and Q(t) on the vertical axis, and shows a time waveform for I(t) and Q(t). Further, FIG. 11B shows the voltage (V) of I(t) on the horizontal axis, the voltage (V) of Q(t) on the vertical axis, and shows a constellation depicted with I(t) and Q(t).

Amplitude component modulation signal a(t) corresponds to the distance between the origin and coordinates (I(t), Q(t)) in the constellation of FIG. 11B. In FIG. 11B, it can be understood that the value for the amplitude component modulation signal a(t) changes substantially with time because the locus of coordinates (I(t), Q(t)) goes far away from the origin and approaches close to the origin. Namely, the envelope level of the vector modulation wave that is the output signal of amplifying section 105 changes substantially.

In the event that a signal of a different envelope level is outputted at the high-frequency amplifier, cases might occur where this pass characteristic is different. Typically, gain characteristics changing according to envelope level are referred to as AM-AM characteristics, and phase characteristics changing according to envelope level are referred to as AM-PM characteristics. Further, normally, a transmission data signal for the case where information is to be transmitted by transmission apparatus is random and, under such operating conditions, the vector modulation wave that is the output signal of the transmission apparatus also behaves in a random manner, and the envelope level changes substantially.

With transmission apparatus 400 of this embodiment, the value of amplitude component modulation signal a(t) outputted by polar coordinate component modulation signal generating section 410 changes substantially with time, the envelope level of the vector modulation wave outputted from amplifying section 105 therefore also changes substantially, and the normal operation conditions of the transmission apparatus exhibit behavior close to the following conditions. Even if amplifying section 105 has pass characteristics such as AM-AM characteristics or AM-PM characteristics, pass characteristics that are close to being under normal operating conditions of the transmission apparatus are maintained at amplifying section 105. As a result, distortion occurring in a vector modulation wave outputted from amplifying section 105 is observed as distortion close to that occurring under normal operating conditions of the transmission apparatus. As a result, it is possible to carry out delay time adjustment based on a signal close to distortion occurring at the time (data transmission time) of a normal transmission operation, so that accuracy of delay time adjustment can be maintained even at the time of normal transmission operation and time adjustment of the amplitude component and phase component can be carried out in a substantially superior manner. As a result, it is possible to obtain a vector modulation wave with substantially little distortion at the time of data transmission.

Figure 12A:
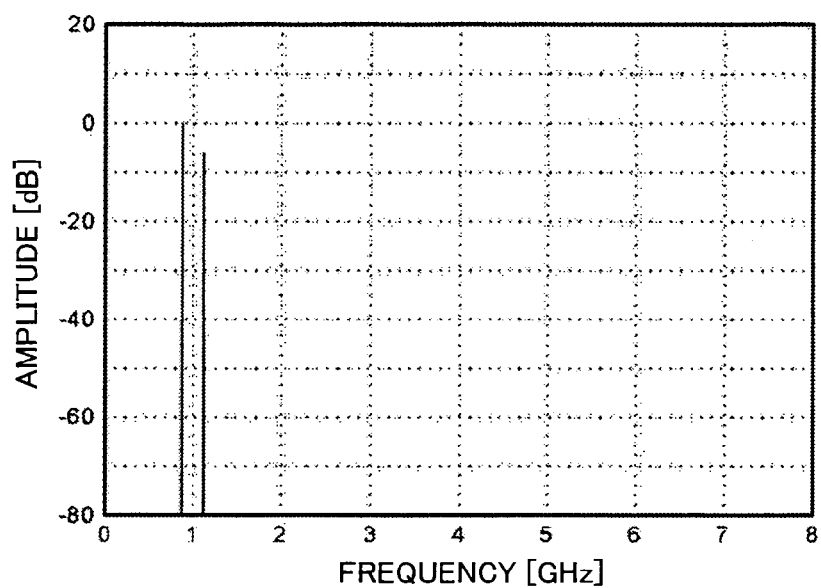
FIG. 12A is a diagram showing a frequency spectrum in the case where a difference in delay time does not exist.
Figure 12B:
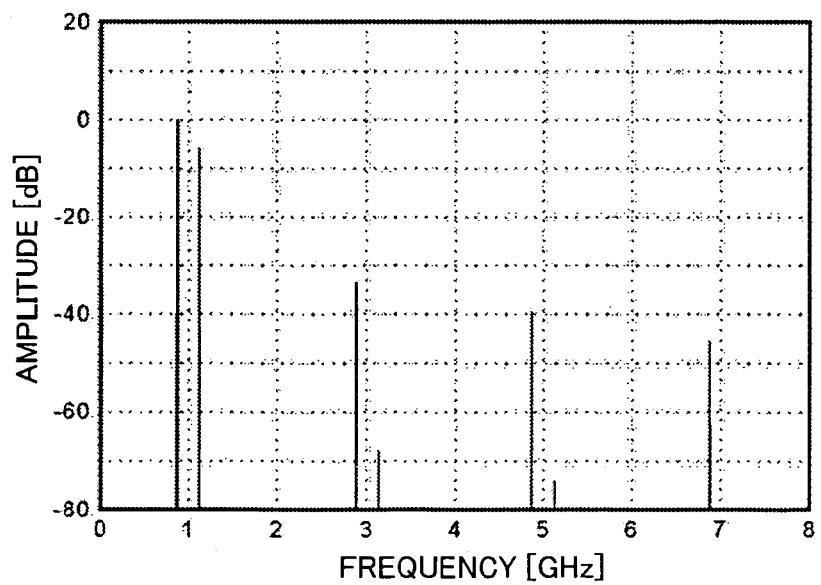
FIG. 12B is a diagram showing a frequency spectrum for the case where a difference in delay time does exist.

FIG. 12 is a characteristic diagram illustrating an operation of synchronous demodulating section 107 of transmission apparatus 400 of this embodiment. Specifically, FIG. 12 is a graph showing a frequency spectrum of a synchronous demodulation signal that is the output signal of synchronous demodulating section 107. As shown in FIG. 12A, when there is no difference in delay time in the paths the amplitude component and the phase component take to reach amplifying section 105, a distortion component does not occur, as shown in FIG. 12B, and, when there is a difference in delay time for the paths taken by the amplitude component modulation signal and the phase modulation wave to reach amplifying section 105, a distortion component occurs. The value of the frequency component of this distortion is a value expressed by the sum of a value that is n times the frequency f1 of a sine wave generated by sine wave generating section 401 and a value that is (n+1) times the frequency f2 of the sine wave generated by sine wave generating section 402. The magnitude relationship of f1 and f2 is not particularly specified.

Band filtering section 412 extracts a signal of a frequency component that is a frequency f3 expressed by the sum of a value that is n times frequency f1 and a value that is (n+1) times frequency f2. At this time, the value of n may be any one value of values that are integers of one or more.

In this way, at transmission apparatus 400 of this embodiment, in-phase/quadrature component modulation signal generating section 411 adds a first sine wave signal having a first frequency f1 and a first phase angle p1 and a second sine wave signal having a second frequency f2 and a first phase angle p1 and forms a signal as an in-phase component modulation signal, and adds a third sine wave signal having the same frequency as the first frequency f1 and second phase angle p2 where the difference with the first phase angle p1 is an odd multiple of ninety degrees and a fourth sine wave signal having the same frequency as the second frequency f2 and having a second phase angle p2 and forms a signals as a quadrature component modulation signal. A signal of a frequency component that is the third frequency f3 expressed by the sum of a value that is n times (where n is an integer of one or more) the first frequency f1 and a value that is (n+1) times the second frequency f2 is then extracted by band filtering section 412. In this way, distortion of the modulation wave is detected with good precision and can be reduced to a sufficiently small level.

In addition, in comparison with the second embodiment, it is possible to carry out delay time adjustment based on a signal close to distortion occurring at the time (data transmission time) of a normal transmission operation, so that accuracy of delay time adjustment can be maintained even at the time of normal transmission operation and time adjustment of the amplitude component and phase component can be carried out in a substantially superior manner. As a result, it is possible to obtain a vector modulation wave with substantially little distortion at the time of data transmission.

In the description of the third embodiment, in-phase/quadrature component modulation signal generating section 411 employs a configuration having a sine wave generating section, phase shifting section and adding section, but a configuration with the sine wave generating section, phase shifting section and adding section is by no means essential. Even if the in-phase/quadrature component modulation signal generating section is not provided with a sine wave generating section, phase shifting section, and adding section, provided that a configuration whereby it is possible to form an in-phase component modulation signal and quadrature component modulation signal as shown in equation (8) and equation (9) in the sine wave phase shifting and addition is provided, it is possible to obtain the same results regardless of the configuration.

Fourth Embodiment

Figure 1:
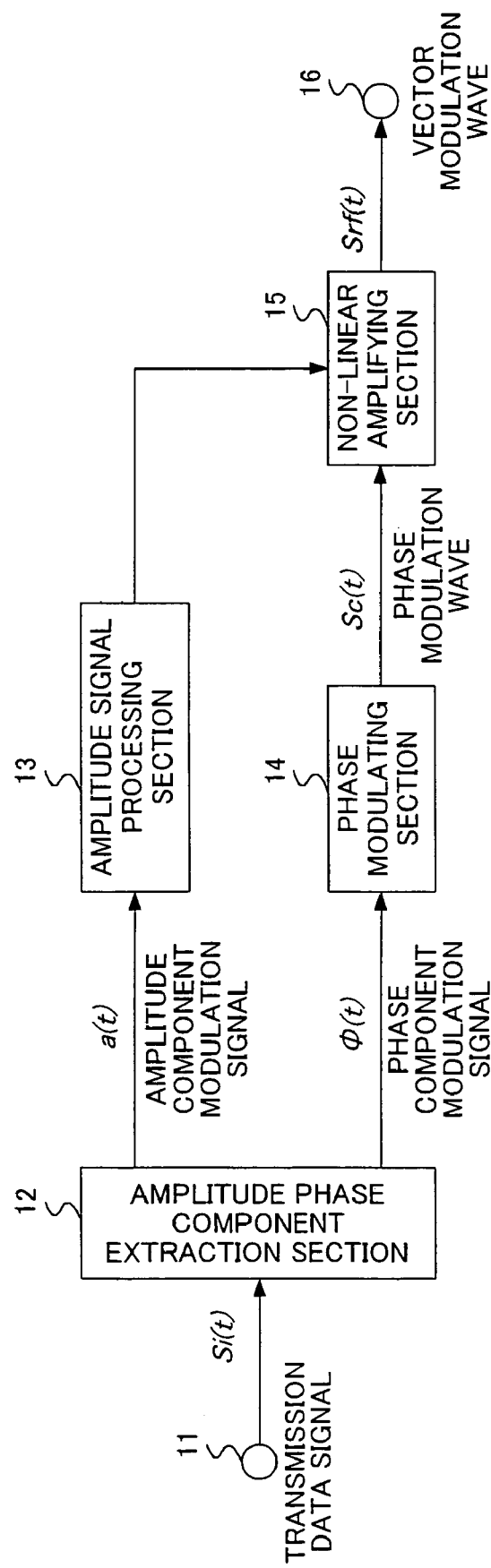
FIG. 1 is a block diagram showing an example configuration of conventional EER transmission apparatus.
Figure 13:
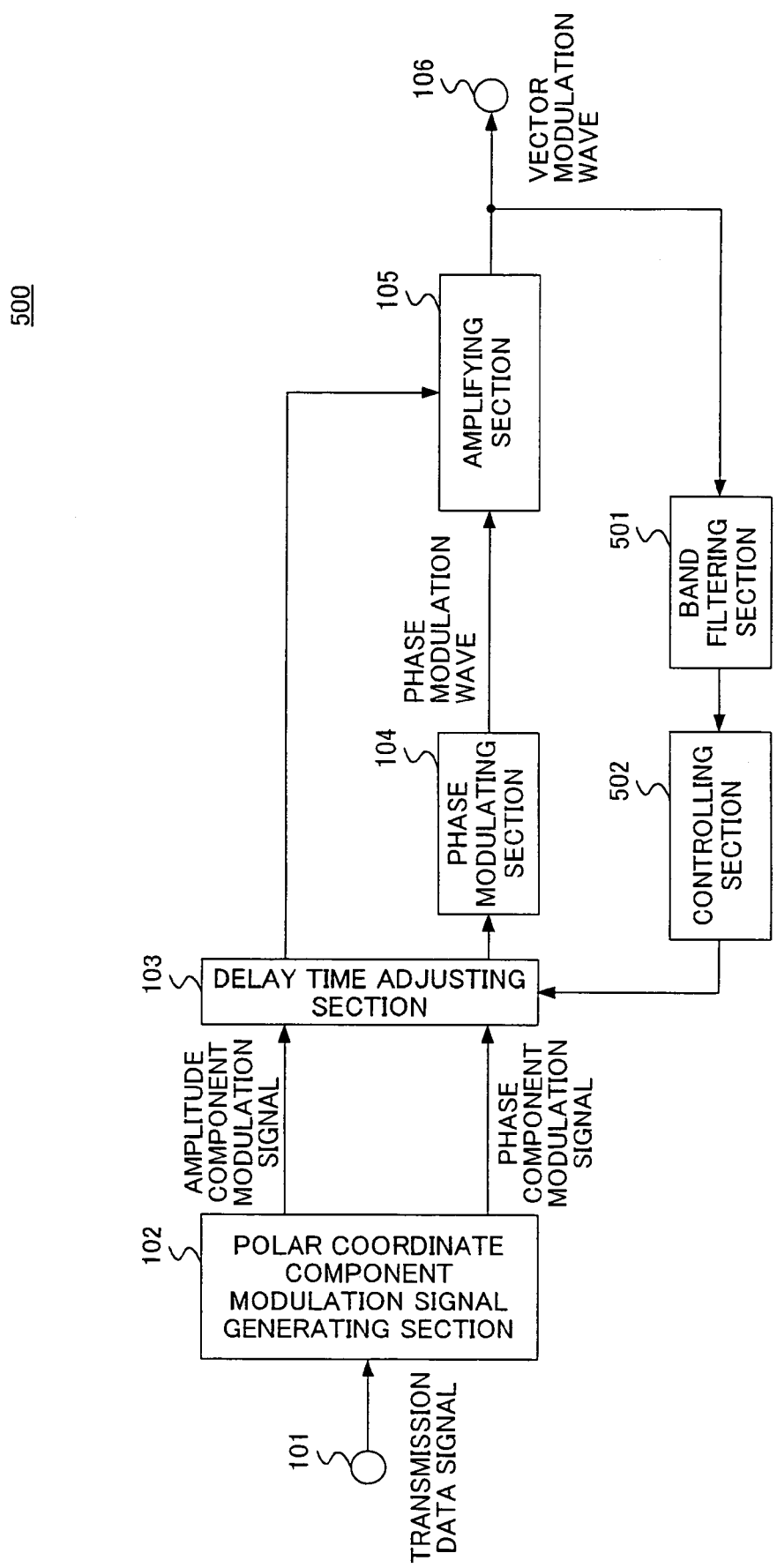
FIG. 13 is a block diagram showing a configuration for a transmission apparatus according to a fourth embodiment of the present invention.

A configuration for a transmission apparatus of this embodiment is shown in FIG. 13, with portions corresponding to FIG. 4 being given the same numerals. Transmission apparatus 500 of this embodiment differs from transmission apparatus 100 of the first embodiment shown in FIG. 1 in that synchronous demodulating section 107 is omitted, and the configuration of band filtering section 501 and controlling section 502 is different from band filtering section 108 and controlling section 109.

Namely, with transmission apparatus 100 of the first embodiment, a description is given of the case where delay time adjusting section 103 is controlled in such a manner as to make the signal level of a distortion component small by extracting the distortion component of the vector modulation wave from the synchronous demodulation signal by band filtering section 108 after frequency conversion of an RF band vector modulation wave to a baseband by synchronous demodulating section 107 and controlling section 109 referring to the signal of the distortion component extracted by band filtering section 108.

Now, by contrast with this, transmission apparatus 500 of this embodiment controls delay time adjusting section 103 in such a manner that an RF band vector modulation signal is directly inputted to band filtering section 501, a distortion component of the vector modulation wave is directly extracted by band filtering section 501, and controlling section 502 refers to a signal of a distortion component extracted by band filtering section 502 and ensures that the signal level of the distortion component becomes small.

Here, band filtering section 501 is comprised of a high-frequency band pass filter through which frequencies of the RF band vector modulation wave that are in the vicinity of the carrier wave frequency are made to pass. Specifically, in the event of inputting the RF band vector modulation wave as shown, for example, in FIG. 2B, band filtering section 501 allows frequencies of 1.935 GHz to 1.945 GHz or 1.955 GHz to 1.965 GHz (i.e. frequencies in the vicinity of the carrier frequency of 1.95 GHz) to pass. Namely, in the event that there is a difference in delay time in the paths to reach amplifying section 105, band filtering section 501 allows frequency components of portions where distortions of the vector modulation wave appear as broadening of the frequency spectrum to pass.

Figure 2B:
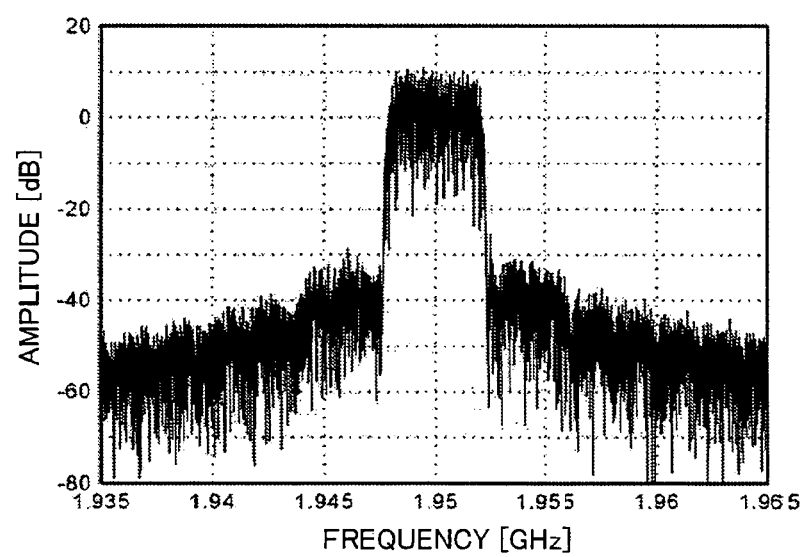
FIG. 2B is a characteristic diagram showing a frequency spectrum for the case where a difference in delay time does exist.
Figure 3:
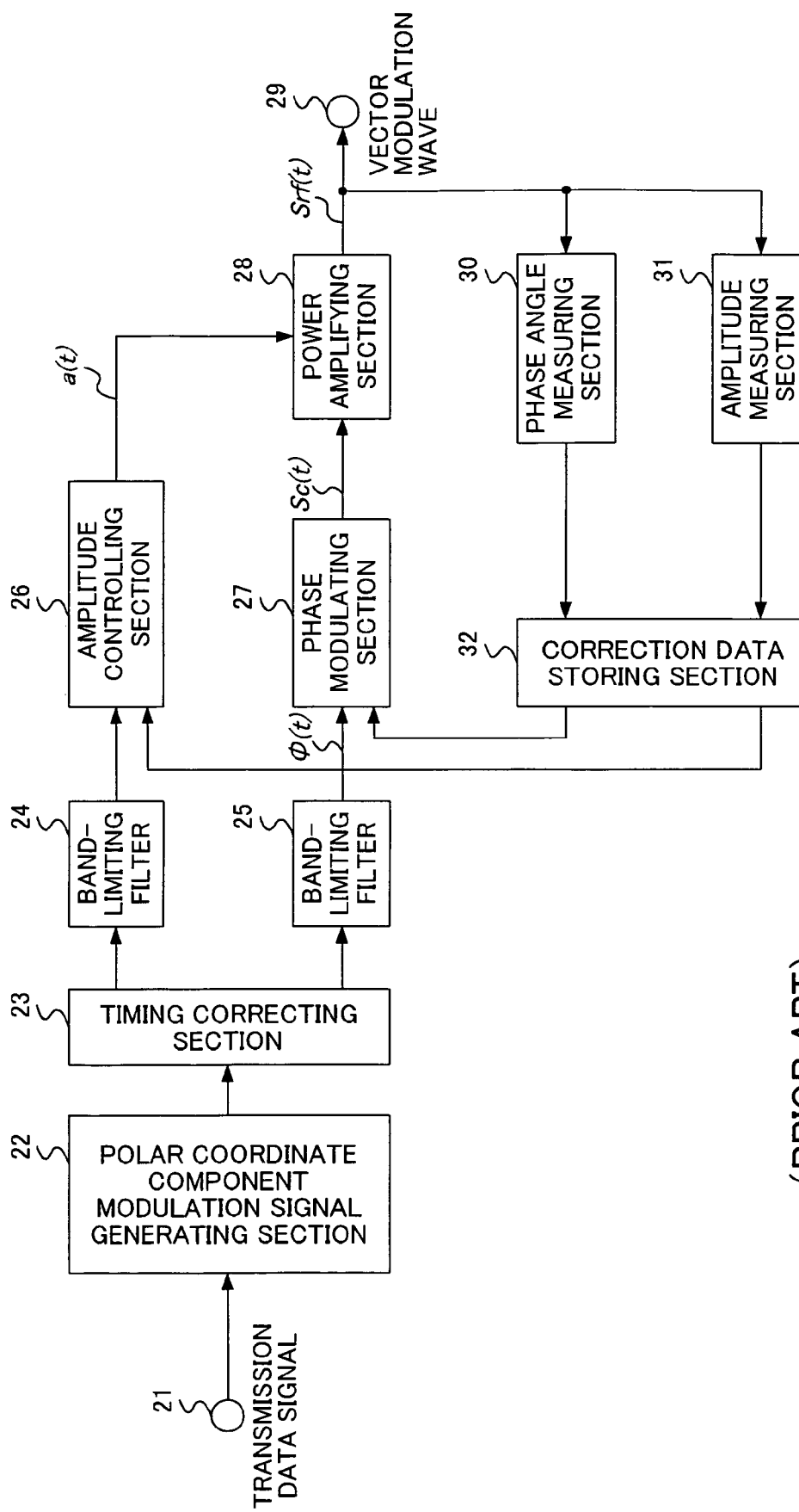
FIG. 3 is a block diagram showing a configuration for conventional EER transmission apparatus for improving distortion of vector modulation waves.

Controlling section 502 observes broadening of the frequency spectrum of the vector modulation wave inputted from band filtering section 501 and adjusts delay time adjusting section 103 in such a manner that broadening of the frequency spectrum becomes small. Namely, the vector modulation wave as shown in FIG. 2B adjusts delay time adjusting section 103 in such a manner as to give the kind of vector modulation wave shown in FIG. 2A.

In this way, at transmission apparatus 500 of this embodiment, by providing band filtering section 501 extracting a signal of a specific frequency component of the vector modulation wave formed by amplifying section 105 and controlling section 502 controlling delay time adjusting section 103 in such a manner that broadening of the frequency spectrum of the vector modulation wave extracted by band filtering section 501 becomes small, it is possible to reduce distortion of a vector modulation wave to a sufficiently small amount without dividing and extracting an amplitude component and phase component from the vector modulation wave.

Fifth Embodiment

Figure 14:
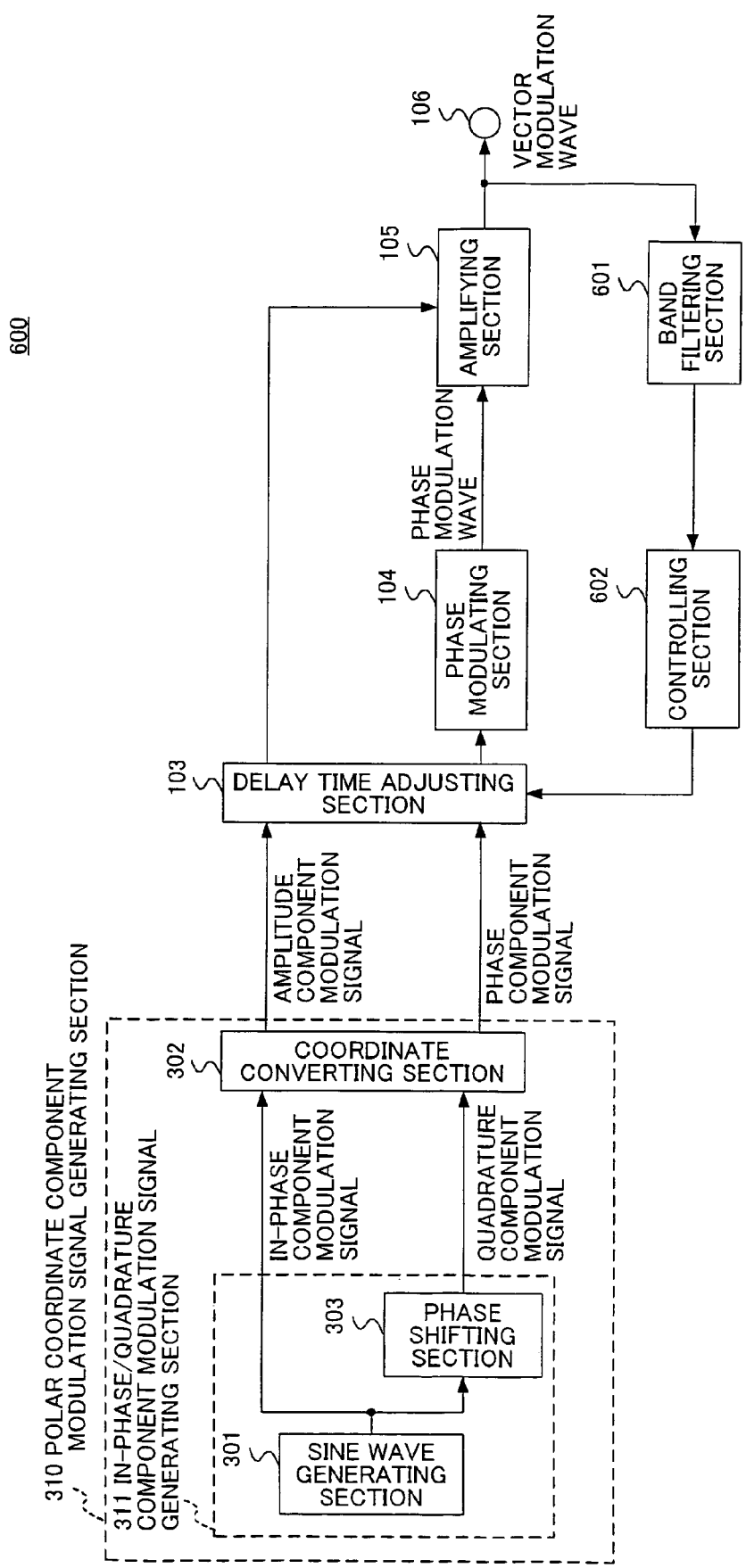
FIG. 14 is a block diagram showing a configuration for a transmission apparatus according to a fifth embodiment of the present invention.

A configuration for a transmission apparatus of this embodiment is shown in FIG. 14, with portions corresponding to FIG. 6 being given the same numerals. Transmission apparatus 600 of this embodiment differs from transmission apparatus 300 of the second embodiment shown in FIG. 6 in that synchronous demodulating section 107 is omitted, and the configuration of band filtering section 601 and controlling section 602 is different from band filtering section 108 and controlling section 109.

Figure 15A:
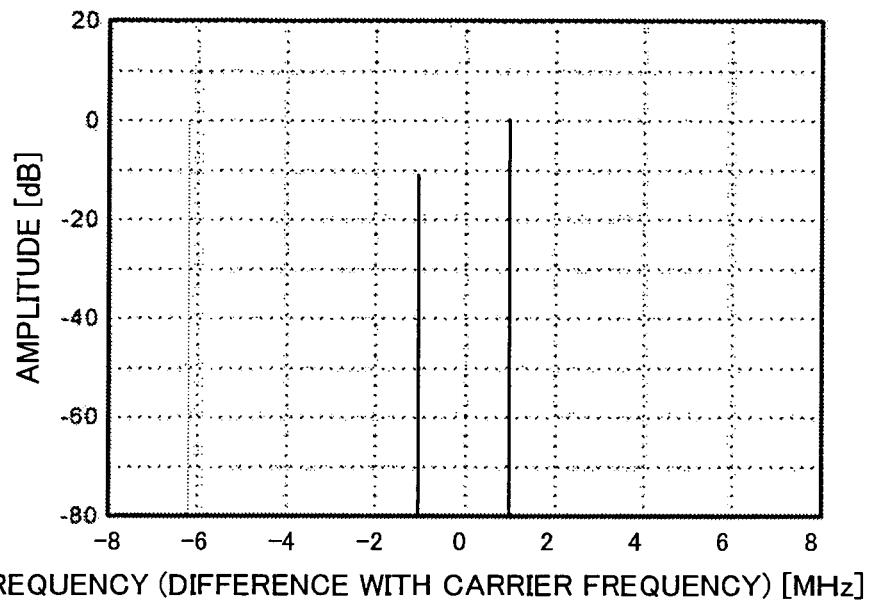
FIG. 15A is a diagram showing a frequency spectrum in the case where a difference in delay time does not exist.
Figure 15B:
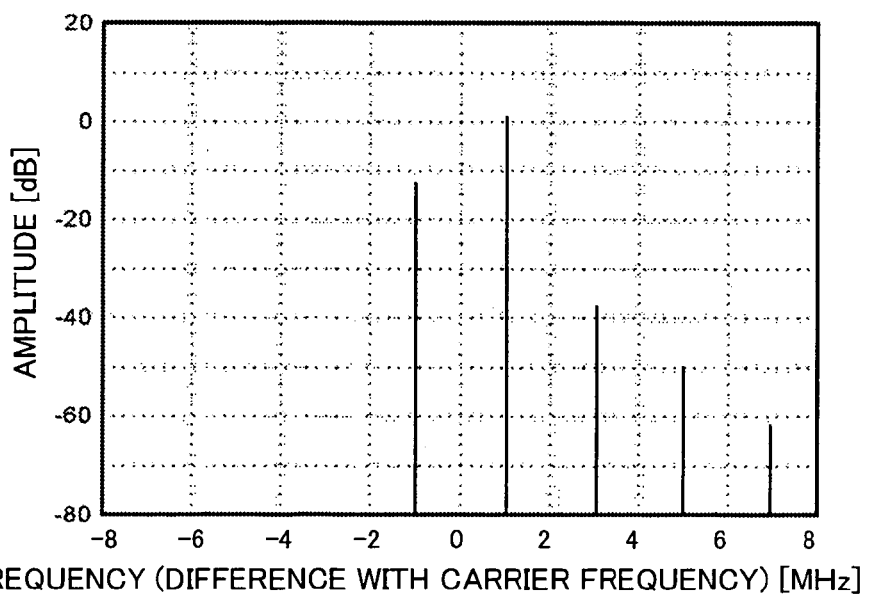
FIG. 15B is a diagram showing a frequency spectrum for the case where a difference in delay time does exist.

First, before describing the configuration in detail, the noted points brought by this embodiment are described. FIG. 15 is a characteristic diagram showing a frequency spectrogram of the vector frequency that is the output signal of amplifying section 105. The horizontal axis shows the difference between the vector modulation wave and the carrier frequency (center frequency) where 0 MHz corresponds to the carrier frequency. When there is a difference between the delay time for the paths the amplitude component modulation signal and the phase modulation wave take to reach amplifying section 105, as shown in FIG. 15A, the difference with the carrier frequency only appears for the 1 MHz component and a distortion component does not occur. However, when there is a difference in delay time in the paths the amplitude component modulation signal and the phase modulation wave take to reach amplifying section 105, as shown in FIG. 15B, the difference with the carrier wave frequency appears as a distortion component at 3 MHz, 5 MHz, and 7 MHz with respect to the frequency of 1 MHz of the sine wave generated by sine-wave generating section 301. Namely, the difference with the carrier frequency for the value of this distortion frequency component has values that are odd-numbered multiples of three or more with respect to the frequency f1 of the sine wave generated by sine-wave generating section 301.

In view of the above, band filtering section 601 of transmission apparatus 600 is configured to extract a signal of a frequency component that is f2 with which the difference with the carrier frequency is represented by a value that is n times the frequency f1 (frequency of a sine wave generated by sine-wave generating section 301). Here, n is any one value of the values that are odd numbers of three or more. In reality, band filtering section 601 may be configured from a band pass filter whereby a component with which the difference with the carrier frequency is f2 that is one of the frequency components occurring in the vector modulation wave outputted by amplifying section 105 is extracted, and a signal component with which the difference with another distortion component or the carrier frequency is f1 is suppressed. Here, a signal component where the difference with another distortion component and a carrier frequency is f1 exists in a frequency isolated from the component where the difference with the carrier frequency is f2 and suppression down to a sufficiently low level can be achieved. The band filtering section 601 is therefore capable of precisely extracting only the distortion component with which the difference with the carrier frequency is f2. The magnitude relationship of the carrier frequency and f2 is not particularly specified.

Controlling section 602 observes the differences with the carrier frequency inputted from band filtering section 601 and adjusts delay time adjusting section 103 in such a manner that the level of the component for f2 becomes small.

With the transmission apparatus 600 of this embodiment, by providing in-phase/quadrature component modulation signal generating section 311 forming a first sine wave signal having a first frequency f1 and a first phase angle p1 as an in-phase component modulation signal and a second sine wave signal having the same frequency as the first frequency f1 and a second phase angle p2 where a difference with the first phase angle p1 is not an integer multiple of ninety degrees as a quadrature component modulation signal, band filtering section 601 extracting from the vector modulation wave formed by amplifying section 105 a signal of a frequency component of f2 with which a difference with a carrier frequency is expressed by a value that is n (any one value of values that are odd numbers of three or more) times the frequency f1 (frequency of a sine wave generated by sine wave generating section 301), and a controlling section 602 observing a component with a difference with the carrier wave frequency extracted by band filtering section 601 of f2 and adjusting delay time adjusting section 103 in such a manner that the level of the component for f2 becomes small, it is possible to reduce distortion of a vector modulation wave to a sufficiently small level.

Sixth Embodiment

Figure 16:
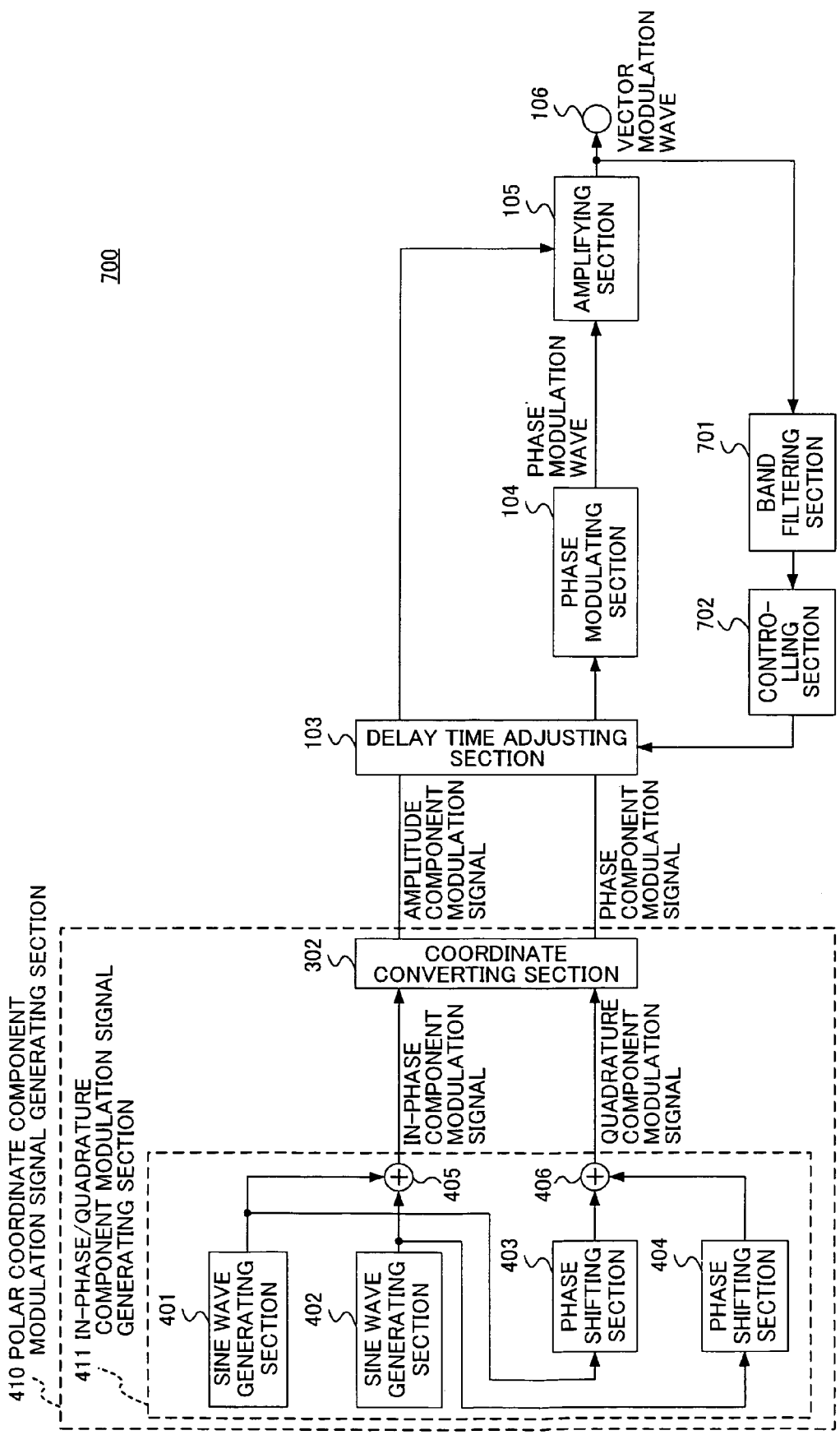
FIG. 16 is a block diagram showing a configuration for a transmission apparatus according to a sixth embodiment of the present invention.

A configuration for a transmission apparatus of this embodiment is shown in FIG. 16, with portions corresponding to FIG. 10 being given the same numerals. Transmission apparatus 700 of this embodiment differs from transmission apparatus 400 of the third embodiment shown in FIG. 10 in that synchronous demodulating section 107 is omitted, and the configuration of band filtering section 701 and controlling section 702 is different from band filtering section 108 and controlling section 109.

Figure 17A:
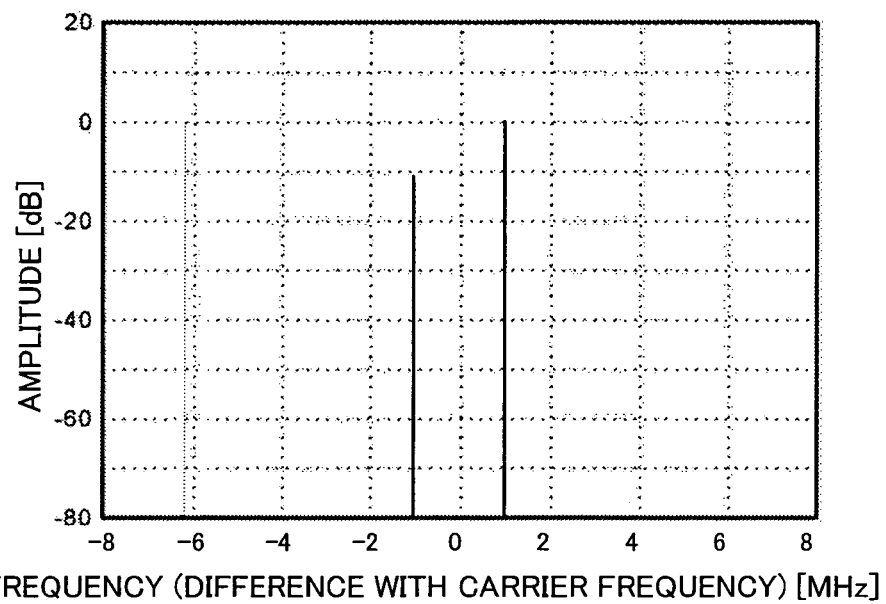
FIG. 17A is a diagram showing a frequency spectrum in the case where a difference in delay time does not exist.
Figure 17B:
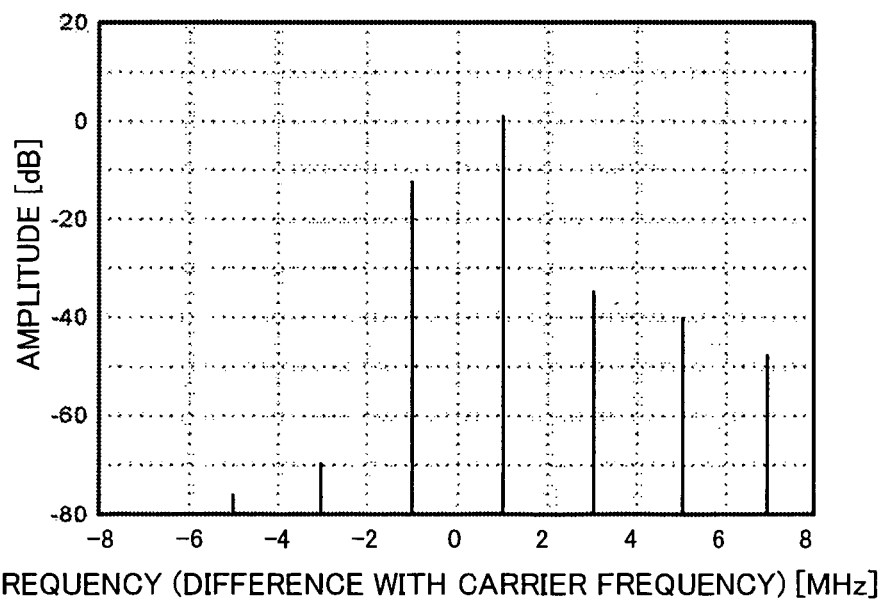
FIG. 17B is a diagram showing a frequency spectrum for the case where a difference in delay time does exist.

First, before describing the configuration in detail, the noted points brought by this embodiment are described. FIG. 17 is a characteristic diagram showing a frequency spectrogram of the vector frequency that is the output signal of amplifying section 105. The horizontal axis shows the difference between the vector modulation wave and the carrier frequency (center frequency) where 0 MHz corresponds to the carrier frequency. When there is no difference in the delay time in the paths the amplitude component modulation signal and phase modulation wave take to reach amplifying section 105, the distortion component shown in FIG. 17A does not occur, but, when there is a difference in delay time in the paths the amplitude component modulation signal and phase modulation wave take to reach amplifying section 105, the kind of distortion component shown in FIG. 17B appears. The value of the frequency component of this distortion is such that a difference with the carrier frequency is a value expressed by the sum of a value that is n times the frequency f1 of a sine wave generated by sine wave generating section 401 and a value that is (n+1) times the frequency f2 generated by sine wave generating section 402. Here, n is an integer of one or more.

Band filtering section 701 of transmission apparatus 700 is configured in such a manner as to extract a signal of a frequency component of frequency f3 expressing a difference with the carrier frequency that is the sum of a value that is n times the frequency f1 (frequency of the sine wave generated by sine wave generating section 401) and a value that is (n+1) times the frequency f2 (frequency of the sine wave generated by sine wave generating section 402). Here, the value of n is any one value of integers of one or more. The magnitude relationship of f1 and f2 and the magnitude relationship of the carrier frequency and f3 are not particularly specified.

Controlling section 702 observes the frequency component of frequency f3 inputted from band filtering section 701 and adjusts delay time adjusting section 103 in such a manner that the level of the component for f3 becomes small.

At transmission apparatus 700 of this embodiment, by providing in-phase/quadrature component modulation signal generating section 411 adding a first sine wave signal having a first frequency f1 and a first phase angle p1 and a second sine wave signal having a second frequency f2 and a first phase angle p1 and forming a signal as an in-phase component modulation signal, and adding a third sine wave signal having the same frequency as the first frequency f1 and second phase angle p2 where the difference with the first phase angle p1 is an odd multiple of ninety degrees and a fourth sine wave signal having the same frequency as the second frequency f2 and having a second phase angle p2 and forming a signal as a quadrature component modulation signal, band filtering section 701 extracting from the vector modulation wave formed by amplifying section 105 a signal of a frequency component of frequency f3 with which the difference with a carrier frequency is expressed by the sum of a value that is n times (where n is an integer of one or more) the frequency f1 and a value that is (n+1) times the frequency f2, and controlling section 702 observing the component of frequency f3 extracted by band filtering section 701 and adjusting delay time adjusting section 103 in such a manner that the level of the component for f3 becomes small, it is possible to reduce distortion of the vector modulation wave to a sufficiently small level without dividing and extracting the amplitude component and the phase component form the vector modulation wave.

Further, it is possible to mount transmission apparatus of each of the embodiments described above on communication apparatus or mobile wireless apparatus. Accordingly, as it is possible to appropriately correct a delay time difference between an amplitude component modulation signal and a phase component modulation signal at transmission apparatus, communication apparatus or mobile wireless apparatus mounted with this transmission apparatus is capable of providing apparatus that can transmit high-quality signals with little distortion component.

The present invention is not limited to the above described embodiments, and various variations and modifications may be possible without departing from the scope of the present invention.

This application is based on Japanese Patent Application No. 2005-81717, filed on Mar. 22, 2005, the entire content of which is expressly incorporated by reference herein.

What is claimed is:

1. A transmission apparatus synthesizing an amplitude component and a phase component using polar modulation and generating and transmitting a vector modulation wave, the transmission apparatus comprising:
  a polar coordinate component modulation signal generating section that forms an amplitude component modulation signal and a phase component modulation signal based on an input signal;
  a delay time adjusting section that changes a delay time difference between the amplitude component modulation signal and the phase component modulation signal;
  a phase modulating section that forms a phase modulation wave where a carrier wave is phase-modulated by the phase component modulation signal;
  an amplifying section that, receiving as input the phase modulation wave at a signal input terminal of the transmission apparatus, with the amplitude component modulation signal applied to a power supply voltage terminal of the transmission apparatus, forms a vector modulation wave where the phase modulation wave is amplitude-modulated by the amplitude component modulation signal;
  a synchronous demodulating section that synchronously demodulates the vector modulation wave and forms a synchronous demodulation signal;
  a band filtering section that extracts and outputs a signal of a specific frequency component contained in the synchronous demodulation signal; and
  a controlling section that controls the delay time adjusting section in such a manner that the level of the output signal of the band filtering section becomes small, wherein:
  the polar coordinate component modulation signal generating section comprises:
    (i) an in-phase/quadrature component modulation signal generating section that forms an in-phase component modulation signal and a quadrature component modulation signal; and
    (ii) a coordinate converting section that forms the amplitude component modulation signal and phase component modulation signal based on the in-phase component modulation signal and the quadrature component modulation signal;
  the in-phase/quadrature component modulation signal generating section forms a first sine wave signal having a first frequency f1 and a first phase angle p1 as the in-phase component modulation signal and a second sine wave signal having a second frequency f2 that is the same as the first frequency of f1 and a second phase angle p2 where the difference with the first phase angle p1 is not an integer multiple of ninety degrees, as the quadrature component modulation signal;
  the band filtering section extracts a signal of a frequency component that is the second frequency f2 expressed by a value that is n times the first frequency f1; and
  the value of n is an odd number of three or more.

2. A transmission apparatus synthesizing an amplitude component and a phase component using polar modulation and generating and transmitting a vector modulation wave, the transmission apparatus comprising:
  a polar coordinate component modulation signal generating section that forms an amplitude component modulation signal and a phase component modulation signal based on an input signal;
  a delay time adjusting section that changes a delay time difference between the amplitude component modulation signal and the phase component modulation signal;
  a phase modulating section that forms a phase modulation wave where a carrier wave is phase-modulated by the phase component modulation signal;
  an amplifying section that, receiving as input the phase modulation wave at a signal input terminal of the transmission apparatus, with the amplitude component modulation signal applied to a power supply voltage terminal of the transmission apparatus, forms a vector modulation wave where the phase modulation wave is amplitude-modulated by the amplitude component modulation signal;
  a synchronous demodulating section that synchronously demodulates the vector modulation wave and forms a synchronous demodulation signal;
  a band filtering section that extracts and outputs a signal of a specific frequency component contained in the synchronous demodulation signal; and a controlling section that controls the delay time adjusting section in such a manner that the level of the output signal of the band filtering section becomes small,
wherein:

the polar coordinate component modulation signal generating section comprises:
  (i) an in-phase/quadrature component modulation signal generating section that forms an in-phase component modulation signal and a quadrature component modulation signal; and
  (ii) a coordinate converting section that forms the amplitude component modulation signal and phase component modulation signal based on the in-phase component modulation signal and the quadrature component modulation signal;

the in-phase/quadrature component modulation signal generating section adds a first sine wave signal of a first frequency f1 and having a first phase angle p1 and a second sine wave signal of a second frequency f2 having the first phase angle p1 and forms a signal as the in-phase component modulation signal, and adds a third sine wave signal of the same frequency as the first frequency f1 and having a second phase angle p2 where a difference with the first phase angle p1 is an odd multiple of ninety degrees, and a fourth sine wave signal having the same frequency as the second frequency f2 and the second phase angle p2 and forms a signal as the quadrature component modulation signal;

the band filtering section extracts a signal of a frequency component that is the third frequency f3 expressed by the sum of a value that is n times the first frequency f1 and a value that is (n+1) times the second frequency f2; and the value of n is an odd number of one or more.

3. A communication apparatus comprising the transmission apparatus of claim 1.

4. A mobile wireless apparatus comprising the transmission apparatus of claim 1.

5. A communication apparatus comprising the transmission apparatus of claim 2.

6. A mobile wireless apparatus comprising the transmission apparatus of claim 2.

* * * * *